United States Patent
Harada et al.

(10) Patent No.: US 7,030,803 B2
(45) Date of Patent: Apr. 18, 2006

(54) ANALOG-TO-DIGITAL CONVERTER AND METHOD OF ANALOG-TO-DIGITAL CONVERSION

(75) Inventors: Takuya Harada, Kariya (JP);
Masakiyo Horie, Gamagoori (JP);
Takuya Honda, Nagoya (JP);
Nobuyuki Tanaka, Aichi-ken (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/052,474

(22) Filed: Feb. 8, 2005

(65) Prior Publication Data
US 2005/0285769 A1    Dec. 29, 2005

(30) Foreign Application Priority Data
Feb. 9, 2004  (JP) ............................. 2004-031945
Feb. 12, 2004 (JP) ............................. 2004-034909

(51) Int. Cl.
*H03M 1/60* (2006.01)
(52) U.S. Cl. ........................ 341/157; 341/155
(58) Field of Classification Search ..................... None
See application file for complete search history.

(56) References Cited

U.S. PATENT DOCUMENTS 5,396,247 A * 3/1995 Watanabe et al. ........... 341/157
6,509,861 B1 * 1/2003 Watanabe ................. 341/157
6,771,103 B1 * 8/2004 Watanabe et al. ........... 327/161
6,940,443 B1 * 9/2005 Terazawa et al. ........... 341/157
2002/0131035 A1 * 9/2002 Watanabe et al. ........... 356/5.1
2005/0057388 A1 * 3/2005 Terazawa et al. ........... 341/157

FOREIGN PATENT DOCUMENTS

JP         5-259907      10/1993
JP         2002-217758    8/2002

* cited by examiner

*Primary Examiner*—Peguy JeanPierre
*Assistant Examiner*—Joseph Lauture
(74) *Attorney, Agent, or Firm*—Posz Law Group, PLC

(57) ABSTRACT

The A/D converter has first and second PPDC circuits (pulse-phase-difference coding circuits). The first PPDC circuit performs A/D conversions on the reference voltage and on the voltage signal amplified by an amplifier in an alternating sequence, the amplifier using the reference voltage as a potential base thereof. The second PPDC circuit performs A/D conversions always on the reference voltage. The A/D-converted data set of the voltage signal outputted from the first PPDC circuit is corrected depending on the difference between the A/D-converted data set of the reference voltage outputted from the second PPDC circuit when the first PPDC circuit A/D-converts the reference voltage and the A/D-converted data set of the reference voltage outputted from the second PPDC circuit when the first PPDC circuit A/D-converts the voltage signal.

16 Claims, 21 Drawing Sheets

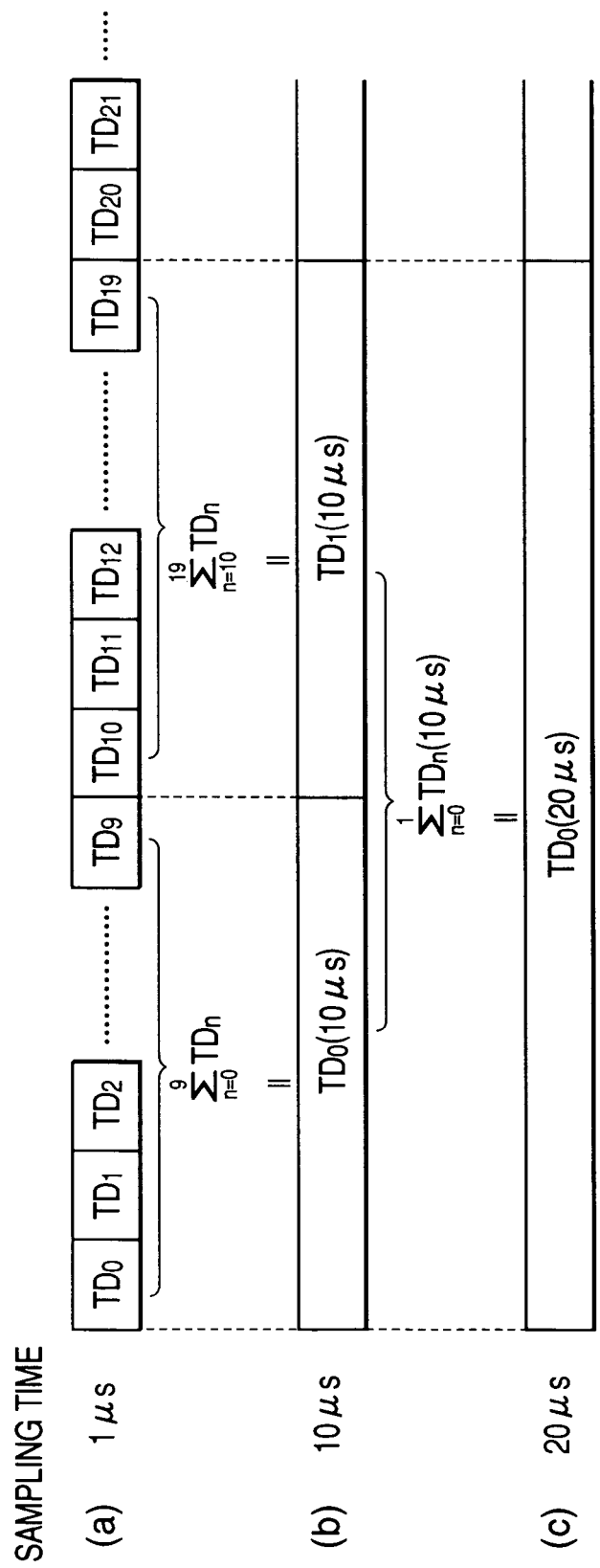

ANALOG-TO-DIGITAL CONVERTER AND METHOD OF ANALOG-TO-DIGITAL CONVERSION

CROSS-REFERENCE TO RELATED APPLICATION

This application is related to Japanese Patent Applications No. 2004-31945 filed on Feb. 9, 2004, and No. 2004-34909 filed on Feb. 12, 2004, the contents of which are hereby incorporated by reference.

BACKGROUND OF THE INVENTION

1. Field of the Invention

The present invention relates to an A/D (analog-to-digital) converter and an A/D conversion method for converting an analog voltage signal into digital data.

2. Description of Related Art

As disclosed in Japanese Patent Application Laid-open No. 5-259907, it is known to convert an analog voltage signal into a digital signal by use of a pulse-phase-difference coding circuit. It is also known to use the pulse-phase-difference coding circuit as a filter for removing high frequency noises included in an input analog voltage signal as disclosed in Japanese Patent Application Laid-open No. 2002-217758.

FIG. 19 shows a structure of such a pulse-phase-difference coding circuit (abbreviated as "PPDC circuit" hereinafter). As shown in this figure, the PPDC circuit 1 includes a pulse-circulating circuit 2, a counter 3, a latch circuit 4, a pulse selector 5, an encoder 6, and a signal processing circuit 7. The pulse selector 5 and the encoder 6 serve as a device for detecting a position of a pulse circulating in the pulse-circulating circuit 2.

The pulse-circulating circuit 2 has a ring delay line constituted by a plurality of inverting gates 2a and a NAND gate 2b connected in the form of a ring, The pulse-circulating circuit 2 begins an oscillation action (pulse signal circulating action) upon receiving a sampling control signal PA outputted from a control circuit 8 at one input terminal of the NAND gate 2b. The counter 3 counts the number of times that the pulse signal circulating in the pulse-circulating circuit 2 has traveled around the ring, and the counted number is latched into the latch circuit 4 as a binary count signal when the control circuit 8 outputs a sampling control signal PB.

The pulse selector 5 generates a position signal indicative of a position of the pulse signal circulating in the pulse-circulating circuit 2. The encoder 6 generates a binary digital signal corresponding to the position signal received from the pulse selector 5. The signal processing circuit 7 combines the binary digital signal received from the latch circuit 4 as higher-order bits and the binary digital signal received from the encoder 6 as lower-order bits into a digital data set D01 representing a measured phase difference between the sampling control signals PA and PB.

Since the measured phase difference (digital data set D01) varies depending on the analog voltage signal vin applied to the NAND gate 2b and the inverting gates 2a, the digital data set D01 represents the value of the analog voltage signal Vin in digital form.

However, converting an analog voltage signal into corresponding digital data by use of such a PPDC circuit 1 involves a problem in that the binary digital data set D01 varies as ambient temperature varies, because the inverting time of each of the NAND gate 2b and the inverting gates 2a is temperature-dependent.

Japanese Patent Application Laid-open No. 5-259907 discloses also an A/D converter free from such a problem. As shown in FIG. 20, this A/D converter is additionally provided with an input selection switch 11, an output selection switch 12, registers 13, 14 and a divider 15, and uses a control circuit 10 instead of the control circuit 8. The control circuit 10 outputs a selection signal SEL to the selection switches 11 and 12.

The selection switch 11 selects alternately one of the analog voltage signal Vin to be converted into digital data and a reference voltage VR in accordance with the selection signal SEL, and outputs it to the PPDC circuit 1 as an analog voltage signal VD1, The PPDC circuit 1 generates alternately a digital data set DVin corresponding to the analog voltage signal vin and a digital data set DR corresponding to the reference voltage VR. The digital data set DVin and the digital data set DR are sent to the register 13 and the register 14, respectively, through the output selection switch 12. The divider 15 outputs a digital data set D02 representing the value of Dvin/DR as a result of the analog-to-digital conversion.

In this structure explained above, even when the inverting times of the NAND gate 2b and the inverting gates 2a vary due to ambient temperature variation and accordingly the data set DVin representing the voltage signal Vin varies, the output data set D02 of the divider 15 is unaffected by this variation, because the data set DR representing the reference voltage VR also varies in the same proportion so as to set off the variation of the data set DVin. With this structure, it is possible to convert the input analog voltage signal Vin into digital data with little influence of ambient temperature variation.

However, there arises a problem in a case where the reference voltage VR is generated by dividing down a power supply voltage of the A/D converter, and the analog input voltage Vin is applied to the PPDC circuit 1 through an amplifier which uses the reference voltage VR as a potential base thereof. In this case, if the power supply voltage varies, the reference voltage VR varies accordingly. If the level of the reference voltage VR when the input selection switch 11 selects the reference voltage VR is different from that when the input selection switch 11 selects the analog voltage signal Vin, the analog-to digital conversion results of the A/D converter do not show correct values.

In addition, the prior art A/D converters shown in FIG. 19 and FIG. 20 have another problem explained below.

In the structure shown in FIG. 19 or 20, a period of time between a moment at which the sampling control signal PA is outputted from the control circuit 8 (or 10) and a moment at which the sampling control signal PB is outputted from the control circuit 8 (or 10) defines a sampling time (A/D conversion time) Tc, The resolution of the A/D conversion depends on the sampling time Tc. For example, if the sampling time Tc is doubled, a voltage step corresponding to one bit step is reduced by half, and the resolution is therefore enhanced. For another example, if the sampling time Tc is reduced to ¹/₁₀, the resolution is reduced to ¹/₁₀. More specifically, in a case where the A/D conversion resolution is 16 bits when the sampling time Tc is 10 μs, if the sampling time Tc is reduced to 1 μs, the A/D conversion resolution is reduced to 13 bits as seen from the graph of FIG. 21.

There is growing need for a knock sensor capable of converting, at high speed and high resolution, weak voltage signals less than 1 mV into digital signals in order to improve knock control of automobile engines. However, the prior art A/D converters as disclosed in Japanese Patent Application Laid-open No. 5-259907 cannot address such a need for the reasons described above.

SUMMARY OF THE INVENTION

In one aspect of the invention, the A/D converter has first and second PPDC circuits. The first PPDC circuit performs A/D conversions on the reference voltage and on the voltage signal amplified by an amplifier in an alternating sequence, the amplifier using the reference voltage as a potential base thereof. The second PPDC circuit performs A/D conversions always on the reference voltage. The A/D-converted data set of the voltage signal outputted from the first PPDC circuit is corrected depending on the difference between the A/D-converted data set of the reference voltage (data set B) outputted from the second PPDC circuit when the first PPDC circuit A/D-converts the reference voltage and the A/D-converted data set of the reference voltage (data set A) outputted from the second PPDC circuit when the first PPDC circuit A/D-converts the voltage signal.

Accordingly, even if the level of the reference voltage (the potential base of the amplifier amplifying the voltage signal) when the first PPDC circuit performs A/D conversion on the reference voltage is different from that when the first PPDC circuit performs A/D conversion on the voltage signal, any resultant variation of the A/D-converted data set of the voltage signal can be corrected.

Furthermore, the corrected A/D-converted data set (data set D) is divided by the A/D-converted data set of the reference voltage (data set F) outputted from the first PPDC circuit. Accordingly, any variation of the A/D-converted data set of the voltage signal due to variation of delay times of the delay gates resulting from ambient temperature variation can be also eliminated as in the case of the prior art A/D converter.

Both the data set A and data set B may be outputted from the second PPDC circuit so that the differential can be obtained with high accuracy.

In another aspect of the invention, the A/D converter is configured to perform a second-order compensation on the A/D-converted data sets of the input analog voltage signal for compensating for nonlinearity of the PPDC circuit by making use of the reference voltage, a high compensation voltage and a low compensation voltage.

With this configuration, it becomes possible to perform A/D conversion with still higher precision and accuracy.

In still another aspect of the invention, the A/D converter has a configuration in which the control circuit operates to supply the pulse-circulating circuit with the sampling control signals in order that the counter outputs the count signal and the position signal generating device (the pulse selector and encoder) generates the position signal of the pulse circulating in the pulse-circulating circuit at each lapse of a sampling time, the differential data set calculating device calculates a differential data set representing a difference between two A/D-converted data sets of the analog voltage signal successively outputted from the PPDC circuit, and the digital low-pass filter filters the differential data set outputted from the differential data set calculating device.

For example, summation of 10 A/D-converted data sets obtained when the sampling time is set at T is equivalent to one A/D-converted data set obtained when the sampling time is set at 10T, because the A/D-converted data sets successively outputted from the PPDC circuit 1 have continuity.

Since each differential data set includes information about an A/D-converted data set having higher resolution (longer sampling time), it is possible to produce a high-resolution A/D-converted data set by low-pass filtering the differential data set.

Accordingly, with this configuration, it becomes possible to provide a high-resolution and high-speed A/D converter.

The differential data set calculating device may include a first latch circuit latching the A/D-converted data set of the analog voltage signal outputted from the PPDC circuit in synchronization with the sampling control signals, a second latch circuit latching the A/D-converted data set stored in the first latch circuit in synchronization with the sampling control signals, and a subtraction circuit subtracting the A/D-converted data set stored in the second latch circuit from an A/D-converted data set next latched in the first latch circuit. In this case, the PPDC circuit can perform the operation of combining the count signal and the position signal, well in advance.

The digital low-pass filter may be an IIR filter having a configuration in which its output signal is fed back and the effect of the past input signal therefore lasts for a long time. Using such an IIR filter makes it possible to reduce the circuit scale of the A/D converter, because the digital filter 14 may have a relatively low filter order in this case.

The A/D converter may have an input selection switch for supplying the PPDC circuit with the analog voltage signal and the reference voltage in an alternating sequence, a register for storing the A/D-converted data set of the reference voltage outputted from the PPDC circuit, a divider dividing the differential data set outputted from the digital low-pass filter by the A/D-converted data set of the reference voltage stored in the register.

By dividing the A/D-converted data set of the voltage signal by the A/D-converted data set of the reference voltage, any variation of the A/D-converted data set of the voltage signal due to variations of the delay times of the delay gates constituting the pulse-circulating circuit can be eliminated.

Since the A/D converted data set of the reference voltage is stored in the register separately from the differential data set, when the PPDC circuit is supplied with the reference voltage, the control circuit may lengthen the sampling time to such an extent that resolution of the A/D-converted data set of the reference voltage becomes equivalent to that of the A/D-converted data set of the voltage signal outputted from the digital low-pass filter.

For example, in a case where the resolution of the A/D-converted data set of the voltage signal is improved by 4 bits by use of the digital low-pass filter, the control circuit may set the sampling time when A/D-converting the reference voltage to a value 16 times longer than the sampling time Set when A/D converting the voltage signal, so that the resolution of the A/D-converted data set of the voltage signal and the resolution of the A/D-converted data set of the reference voltage become the same.

BRIEF DESCRIPTION OF THE DRAWINGS

In the accompanying drawings:

FIG. 14 is an explanatory view explaining continuity of A/D-converted data sets in the A/D converter according to the seventh embodiment;

PREFERRED EMBODIMENTS OF THE INVENTION

First Embodiment

Figure 1:
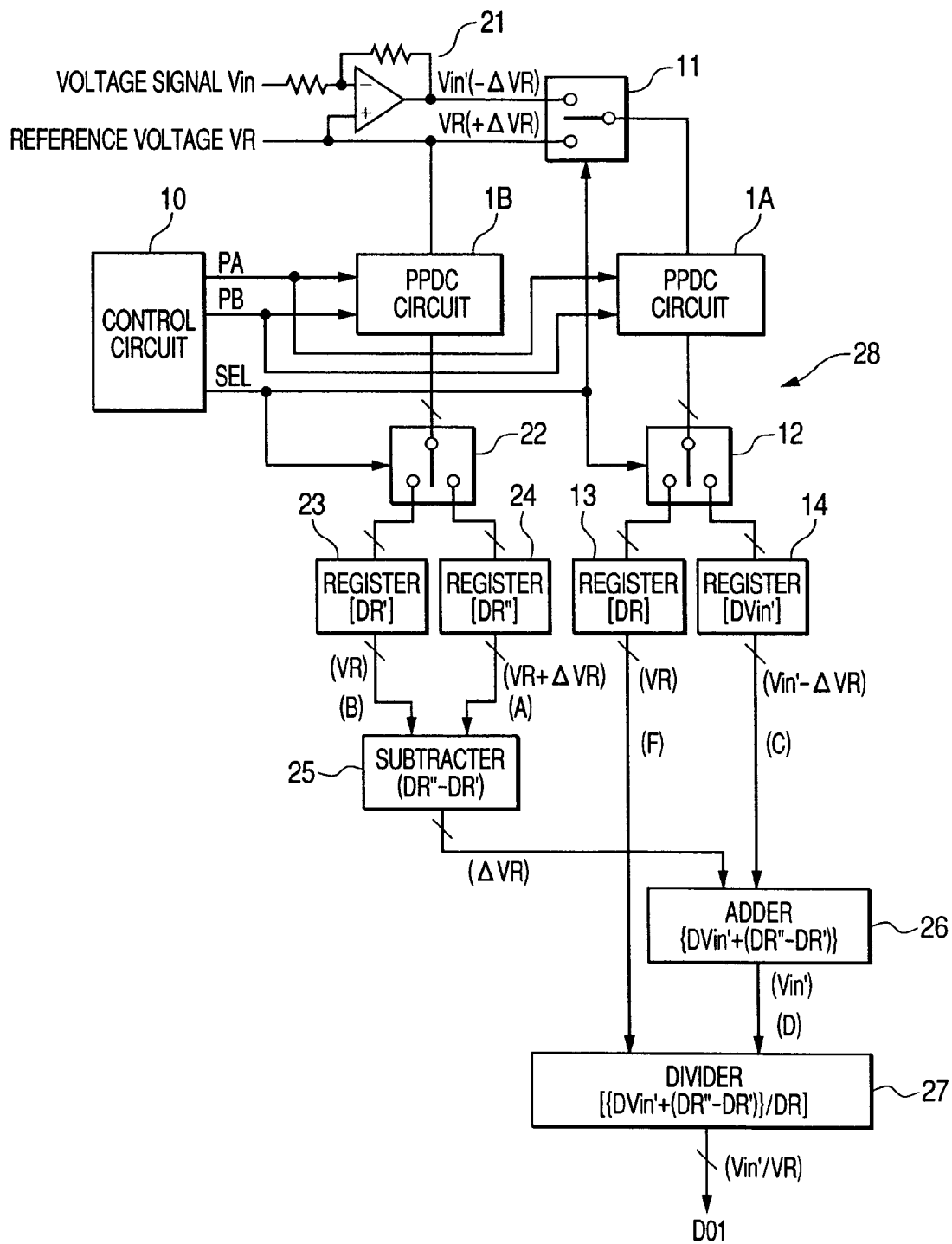
FIG. 1 is a block diagram showing a structure of an A/D converter according to a first embodiment of the invention.
Figure 19:
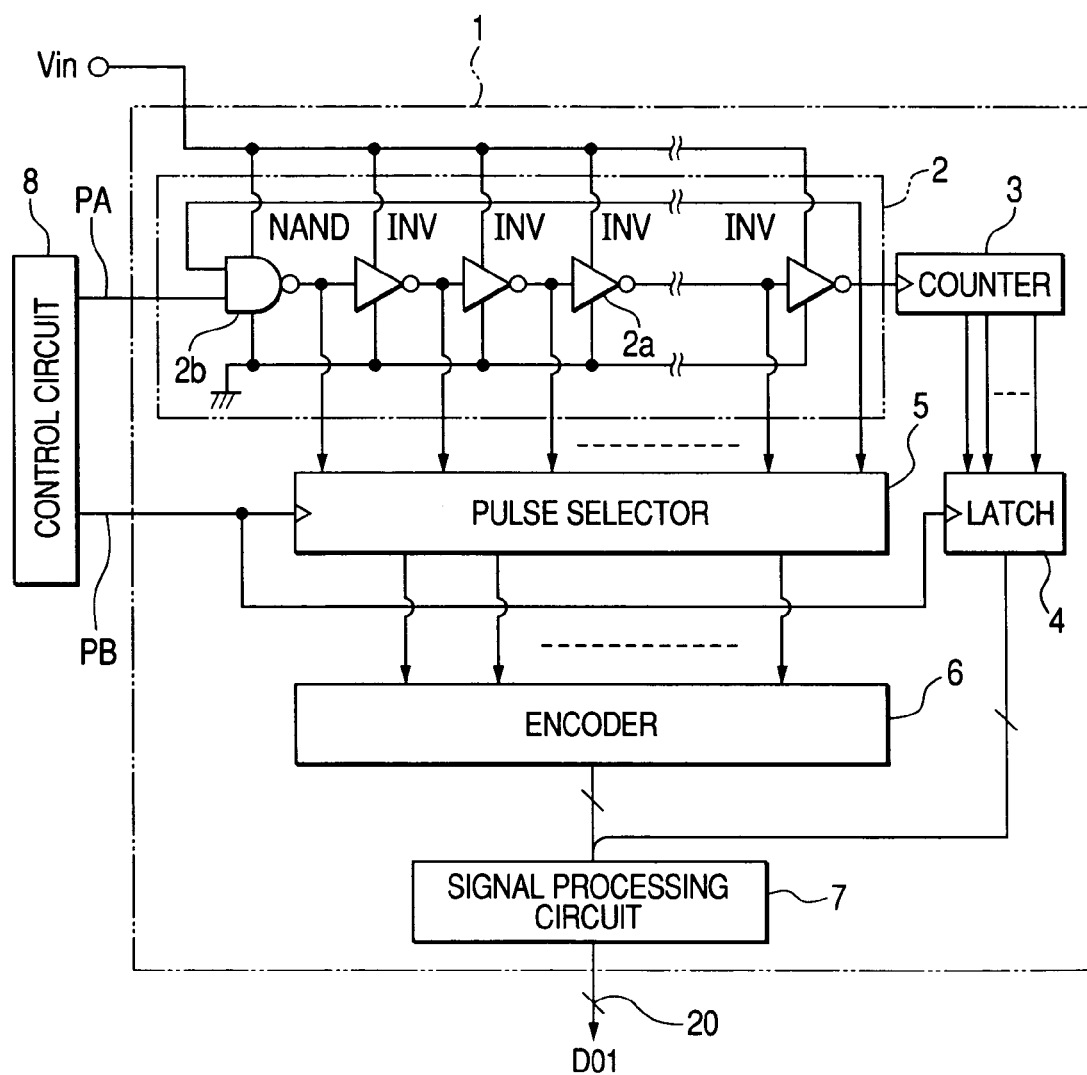
FIG. 19 is a block diagram showing 8 structure of a prior art A/D converter using a pulse-phase-difference coding circuit.
Figure 20:
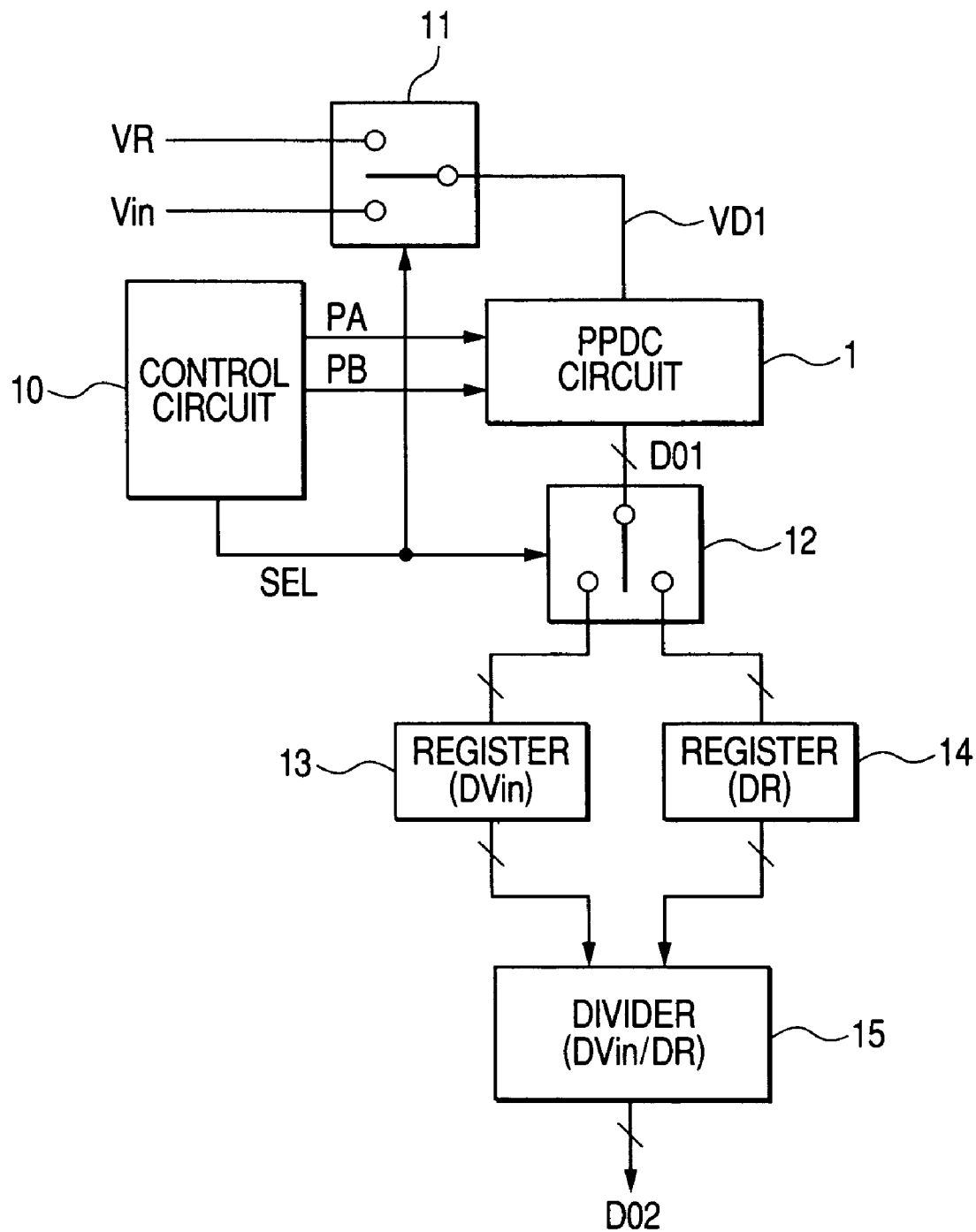
FIG. 20 is a block diagram showing a structure of another prior art A/D converter using the pulse-phase-difference coding circuit.
Figure 21:
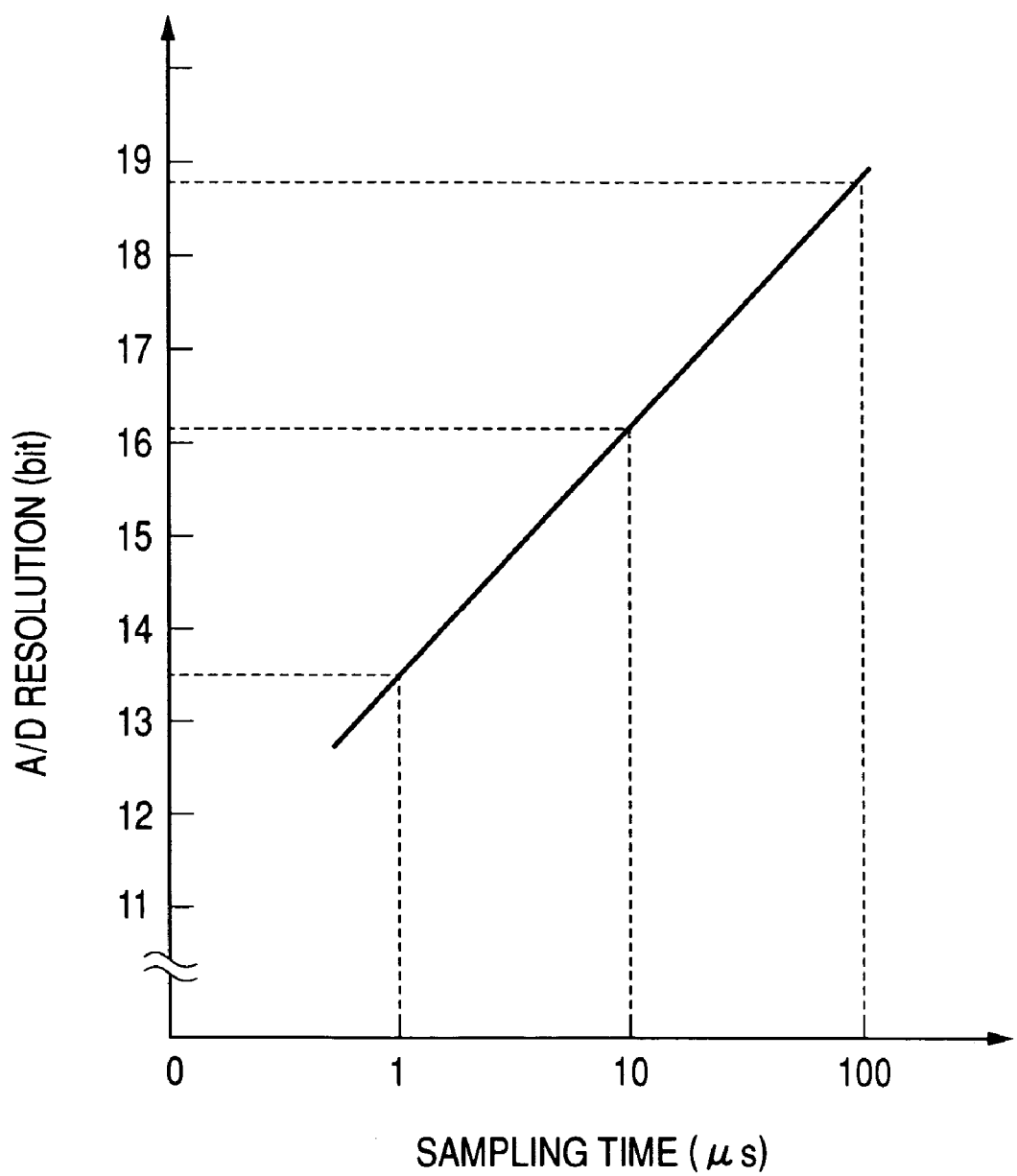
FIG. 21 is a graph showing the relationship between resolution of an A/D-converted data set and a sampling time.

FIG. 1 is a block diagram showing a structure of an A/D converter according to a first embodiment of the invention. As shown in FIG. 1, this A/D converter 28 includes a PPDC (Pulse-Phase-Difference Coding) circuit 1A, a PPDC circuit 1B, a control circuit 10, an inverting amplifier 21, an input-selection switch 11, output selection switches 12, 22, registers 13, 14, 23, 24, a subtracter 25, an adder 26, and a divider 27. The PPDC circuits 1A and 1B have the same structure and operate in a like manner as the PPDC circuit 1 shown in FIG. 19.

The analog voltage signal Vin is amplified by the inverting amplifier 21 and then outputted to the input selection switch 11 as an analog voltage signal Vin'. The gain of the inverting amplifier 21 is one. The input selection switch 11 selects one of the analog voltage signal Vin' and the reference voltage VR in accordance with a selection signal SEL received from the control circuit 10, and supplies it to the PPDC circuit 1A, The reference voltage VR is obtained by dividing down a power supply voltage of this A/D converter 28.

The digital data set Dvin' corresponding to the analog voltage signal Vin' and the digital data set DR corresponding to the reference voltage VR which are outputted from the PPDC circuit 1A are sent to the register 13 and the register 14, respectively, through the output selection switch 12 that selects one of the data set Dvin' and the data set DR in accordance with the selection signal SEL received from the control circuit 10.

The PPDC circuit 1B receives the sampling control signals PA and PB outputted from the control circuit 10 together with the PPDC circuit 1A. However, the PPDC circuit 1B is applied with only the reference voltage VR. The PPDC circuit 1B outputs a digital data set DR' and a digital data set DR" to the registers 23 and 24 through the output selection switch 22 which selects one of the data set DR' and data set DR" in accordance with the selection signal SEL. The data set DR' is a data set which the PPDC circuit 1B generates by A/D-converting the reference voltage VR at the same timing at which the PPDC circuit 1A A/D-converts the very reference voltage VR. The data set DR" is a data set which the PPDC circuit 1B generates by A/D-converting the reference voltage VR at the same timing at which the PPDC circuit 1A A/D-converts the analog voltage signal Vin'.

The data sets DR, DR" latched in the registers 23, 24 are given to the subtracter 25 which performs subtraction of (DR"−DR'). The data set Dvin' latched in the register 14 and the result of the subtraction performed by the subtracter 25 are given to the adder 26 which performs addition of (Dvin'+(DR"−DR')). The result of the addition performed by the adder 26 is given to the divider 27. The divider 27 outputs a data set D01 representing the value of [(Dvin'+(DR"−DR'))/DR] as a final result of the A/D conversion.

Figure 2:
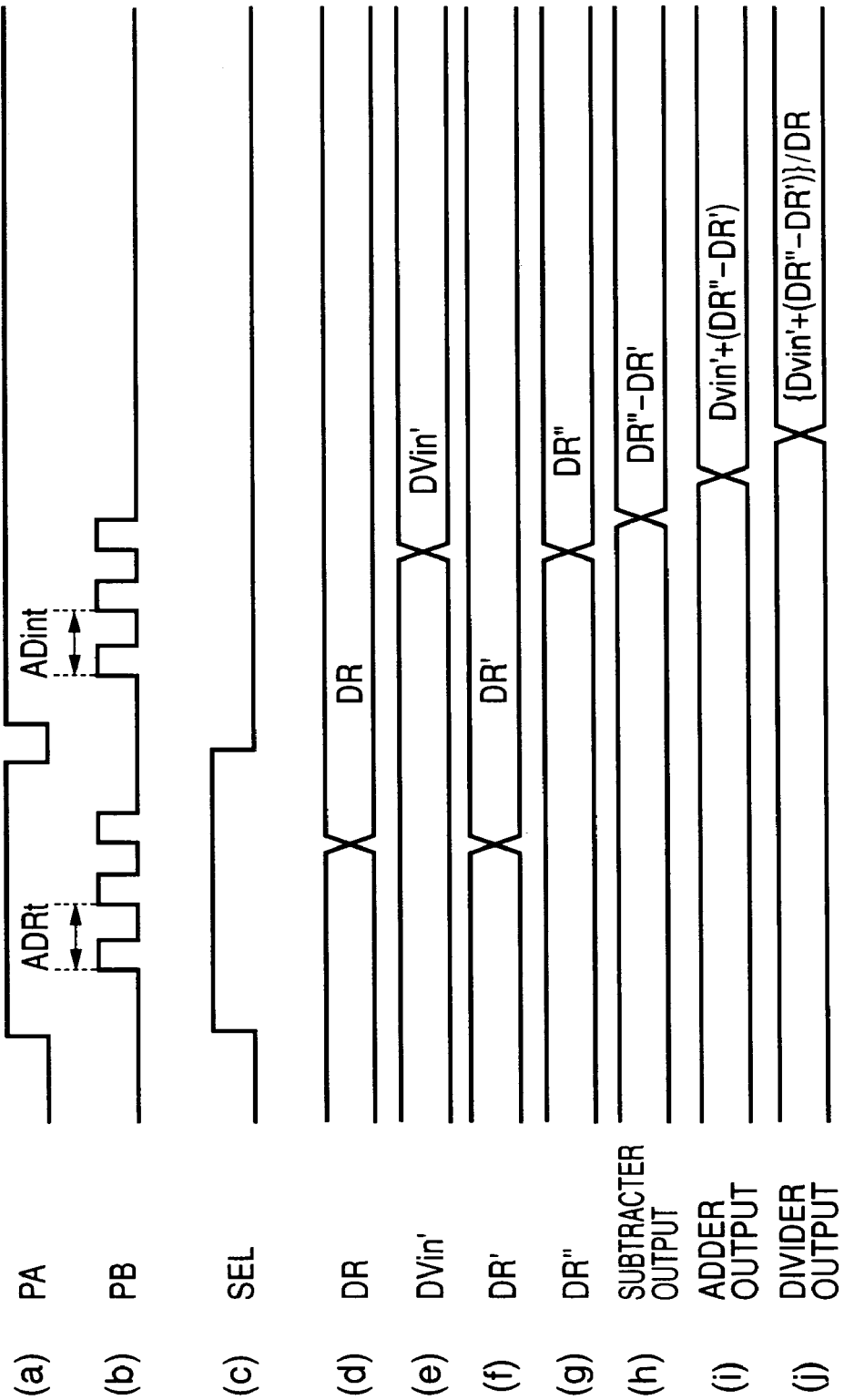
FIG. 2 is a timing chart of various signals in the A/D converter according to the first embodiment.
Figure 3:
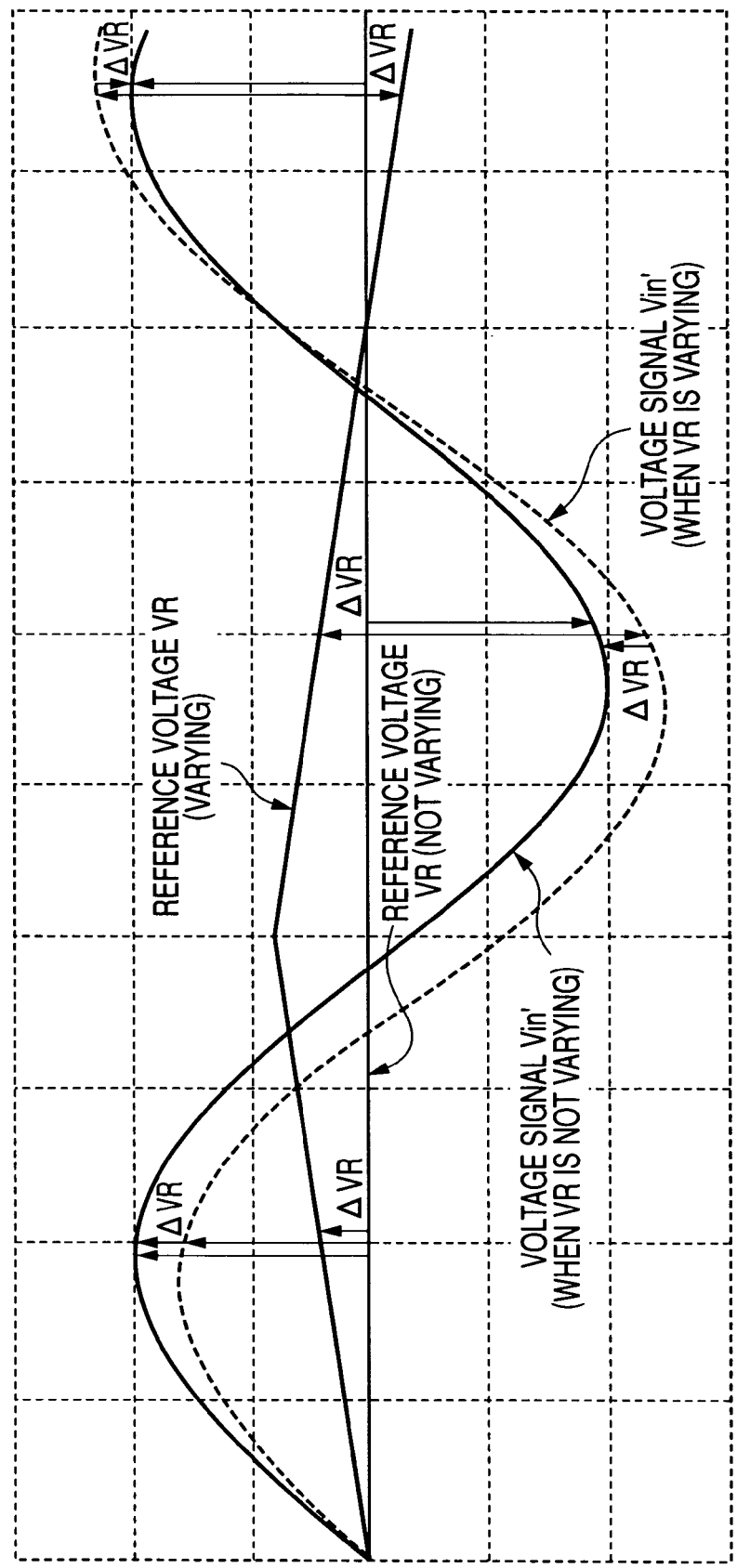
FIG. 3 is a waveform diagram showing variations over-time of an analog voltage signal and a reference voltage in the first embodiment.

Next, the operation of the A/D converter 28 having the structure described above is explained below with reference to FIG. 2 and FIG. 3. FIG. 2 is a timing chart of various signals within the A/D converter 28, and FIG. 3 is a waveform diagram showing variations overtime of the analog voltage signal Vin' and the reference voltage VR. The PPDC circuit 1A performs A/D conversions on the reference voltage VR and analog voltage signal Vin' inputted alternately thereto through the input selection switch 11 that selects one of the reference voltage VR and analog voltage signal Vin' in accordance with the selection signal SEL ((c) in FIG. 2). The sampling control signal PA becomes active twice in every A/D conversion cycle for A/D-converting the reference voltage VR and the analog voltage signal Vin' ((a) in FIG. 2). The PPDC circuit 1A outputs the data sets DR, DVin as results of A/D conversions on the reference voltage VR and the analog voltage signal Vin', and they are stored in the register 13 and register 14, respectively ((d), (e) in FIG. 2).

In a case where the sampling control signal PB is made active a plurality of times after the sampling control signal PA becomes active, the output cycle period of the sampling control signal PB defines the A/D conversion time (the sampling time ADRt or ADint) ((b) in FIG. 2). In a case where the sampling control signal PB is made active only once after the signal PA becomes active, a time interval between the rising edge of the signal PA and the rising edge of the signal PB defines the A/D conversion time.

The PPDC circuit 1B performs A/D conversions always on the reference voltage VR. The data set (B) obtained by A/D-converting the reference voltage VR at the same timing at which the PPDC circuit 1A A/D-converts the same reference voltage VR is stored in the register 23 ((f) in FIG. 2). The data set (a) obtained by A/D-converting the reference voltage VR at the same timing at which the PPDC circuit 1A A/D-converts the analog voltage signal Vin' is stored in the register 24 ((g) in FIG. 2.

The subtraction of (DR"−DR') is performed at the subtracter 25 ((h) in FIG. 2). The result of the subtraction is added to the data set (C) stored in the register 14 at the adder 26 ((i) in FIG. 2). The addition result (D) representing (Dvin'+(DR"−DR')) is divided by the data set (F) stored in the register 13 at the divider 27 ((j) in FIG. 2). The division result representing the value of [(Dvin'+(DR"−DR'))/DR] is outputted as an A/D-converted data set D01.

Here, assume that the reference voltage VR has increased by +ΔVR since the time when the PPDC circuit 1A performed A/D conversion on the reference voltage VR, so that the value of the analog voltage signal Vin' presently received by the PPDC circuit 1A is represented by (Vin−ΔVR) (see FIG. 3), and the value of the reference voltage VR presently received by the PPDC circuit 1B is represented by (VR+ΔVR). In this case, the result of the subtraction performed by the subtracter 25 is a data set representing the value of (Vin'−ΔVR)+ΔVR=Vin'. Thus, the variation ΔVR of the reference voltage VR is canceled out. In consequence, a data set representing the value of (Vin'/VR) is obtained at the divider 27.

As explained above, even when the inverting times of the NAND gate and the inverting gates of the PPDC circuit 1A vary due to ambient temperature variation, and the data set DVin representing the analog voltage signal Vin' varies accordingly, the output level of the divider 27 is unaffected by this variation, because the data set DR representing the reference voltage VR varies so as to set off the variation of the data set DVin.

As described above, the A/D converter 28 according to the first embodiment of the invention is configured such that the control circuit 10 controls the two PPDC circuits 1A and 1B having the same structure to perform A/D converting operations simultaneously. More specifically, the PPDC circuit 1A performs A/D conversions on the reference voltage VR and the analog voltage signal Vin' amplified by the inverting amplifier 21 in an alternating sequence, while the PPDC circuit 1B performs A/D conversions always on the reference voltage VR.

When the PPDC circuit 1A receives the voltage signal Vin', the subtracter 25 performs the subtraction of (DR"−DR'), the adder 26 performs the addition of (Dvin'+(DR"−DR')), and the divider 27 performs the division of [(Dvin'+(DR"−DR'))/R]. This makes it possible to remove the influence of the variation of the reference voltage VR and to remove the influence of the variation of the delay times of the NAND gate and the inverting gates due to ambient temperature variation, even in a case where the analog voltage signal Vin is inverted and amplified by the inverting amplifier 21.

Furthermore, in this embodiment, the data set DR' and the data set DR" are produced through A/D conversions on the reference voltage VR performed by the identical PPDC circuit 1B, it is possible to obtain the differential data set representing the value of DR"−DR' with high accuracy.

Second Embodiment

Figure 4:
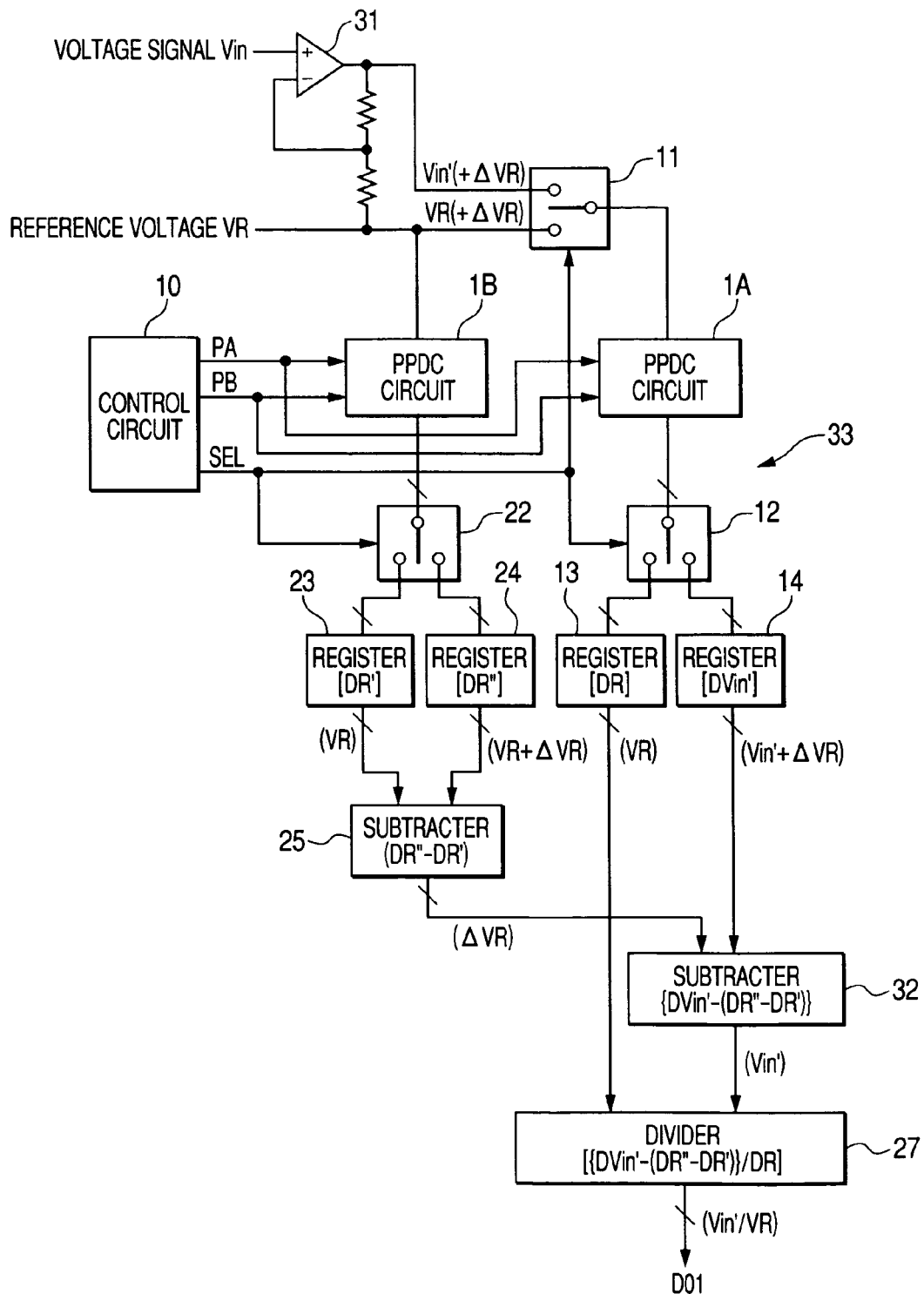
FIG. 4 is a block diagram showing a structure of an A/D converter according to a second embodiment of the invention.

FIG. 4 is a block diagram showing a structure of an A/D converter 33 according to a second embodiment of the invention. In FIG. 4, elements that are the same as those shown in FIG. 1 are given the same reference characters, and explanation thereof will be omitted. The second embodiment is different from the first embodiment in that the second embodiment uses a non-inverting amplifier 31 and a subtracter 32 (variation compensation circuit) instead of the inverting amplifier 21 and the adder 26.

Figure 5:
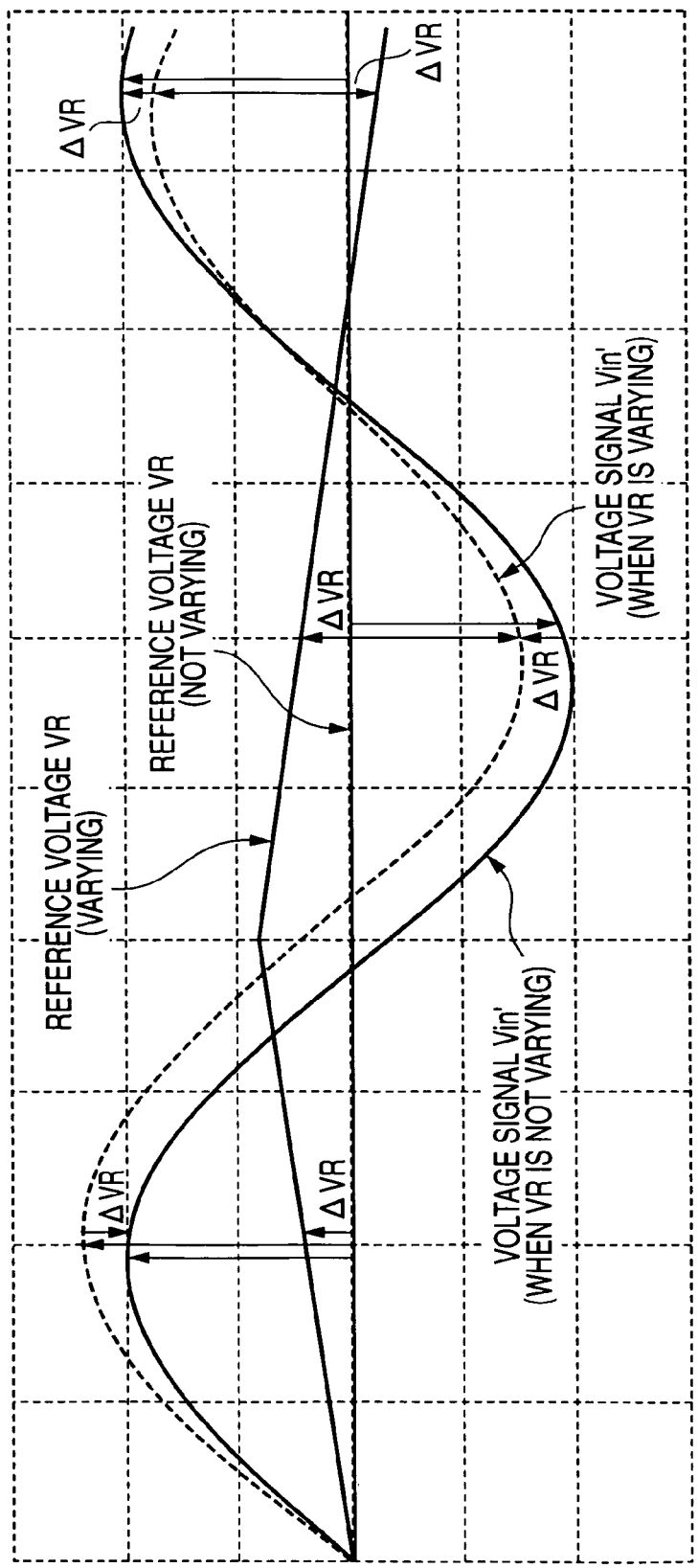
FIG. 5 is a waveform diagram showing variations overtime of an analog voltage signal and a reference voltage in the second embodiment.

The operation of the A/D converter 33 according to the second embodiment of the invention is explained below. Assume that the reference voltage VR has increased larger by +ΔVR since the time when the PPDC circuit 1A performed A/D conversion on the reference voltage VR, so that the value of the analog voltage signal Vin' presently received by the PPDC circuit 1A is represented by (Vin+ΔVR) (see FIG. 5).

In this case, the subtracter 32 outputs, as a subtraction result, a data set representing the value of (Vin'+ΔVR)−ΔVR=Vin'. Thus, the variation delta VR of the reference voltage VR is canceled out. Except for the above, the second embodiment operates in the same way as the first embodiment. As explained above, in the case of A/D-converting the analog voltage signal Vin amplified by the non-inverting amplifier, the same advantages as in the case of A/D-converting the analog voltage signal Vin amplified by the inverting amplifier can be obtained.

Third Embodiment

Figure 6:
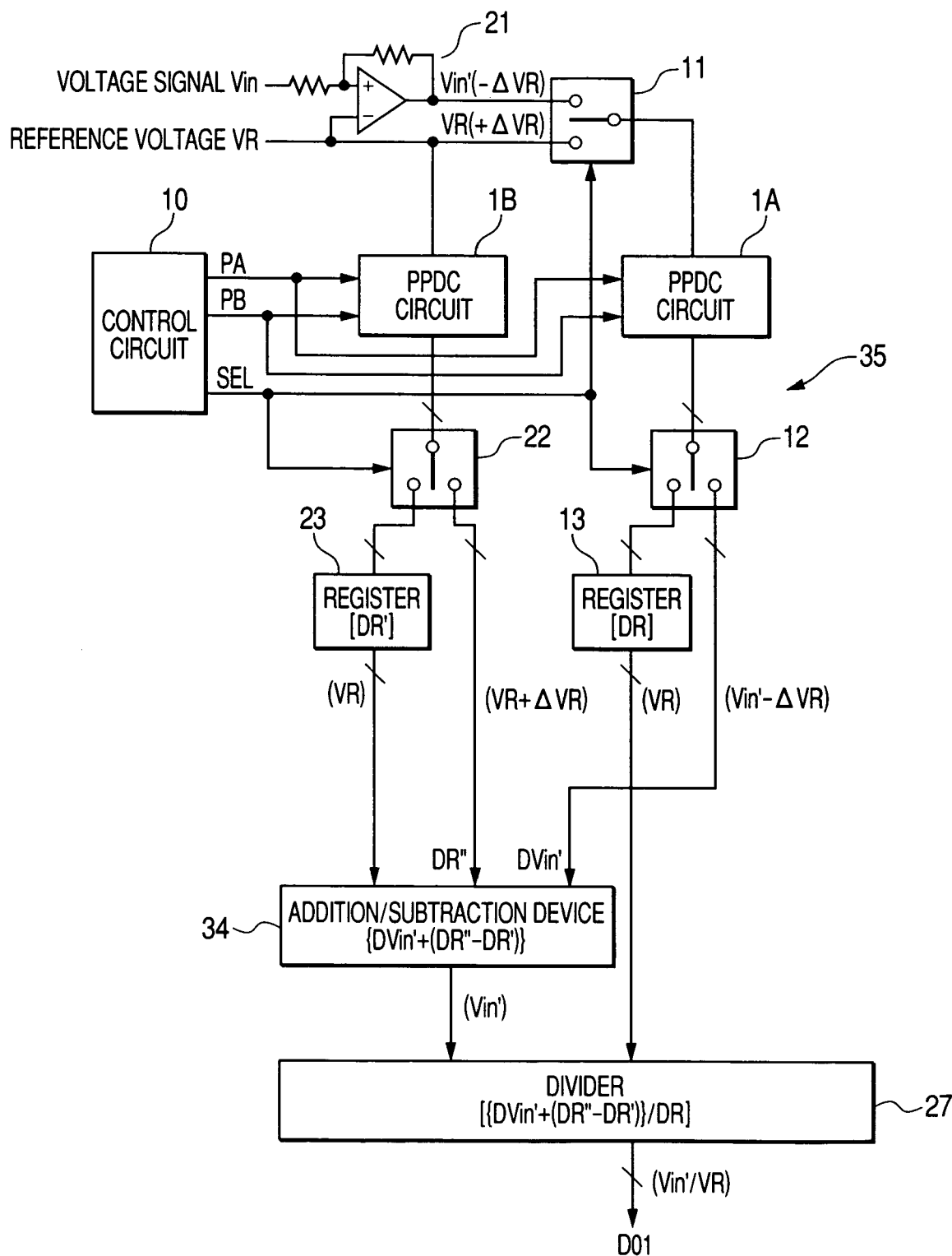
FIG. 6 is a block diagram showing a structure of an A/D converter according to a third embodiment of the invention.

FIG. 6 is a block diagram showing a structure of an A/D converter 35 according to a third embodiment of the invention. The third embodiment is different from the first embodiment in that the registers 14, 24 are eliminated, and the subtracter 25 and the adder 26 are replaced by a subtraction/addition device (variation compensation circuit) 34.

In the third embodiment, the data set DR and the data set DR' A/D-converted by the PPDC circuit 1A and the PPDC circuit 1B, respectively, are stored in the register 13 and 23, respectively, as with the case of the first embodiment. However, the data set representing the value of (Vin'−ΔVR) A/D-converted by the PPDC circuit 1A, and the data set representing the value of (VR) or (VR+ΔVR) A/D-converted by the PPDC circuit 1B are directly sent to the subtraction/addition device 34. Accordingly, the third embodiment can be made simpler than the first embodiment in structure.

Fourth Embodiment

Figure 7:
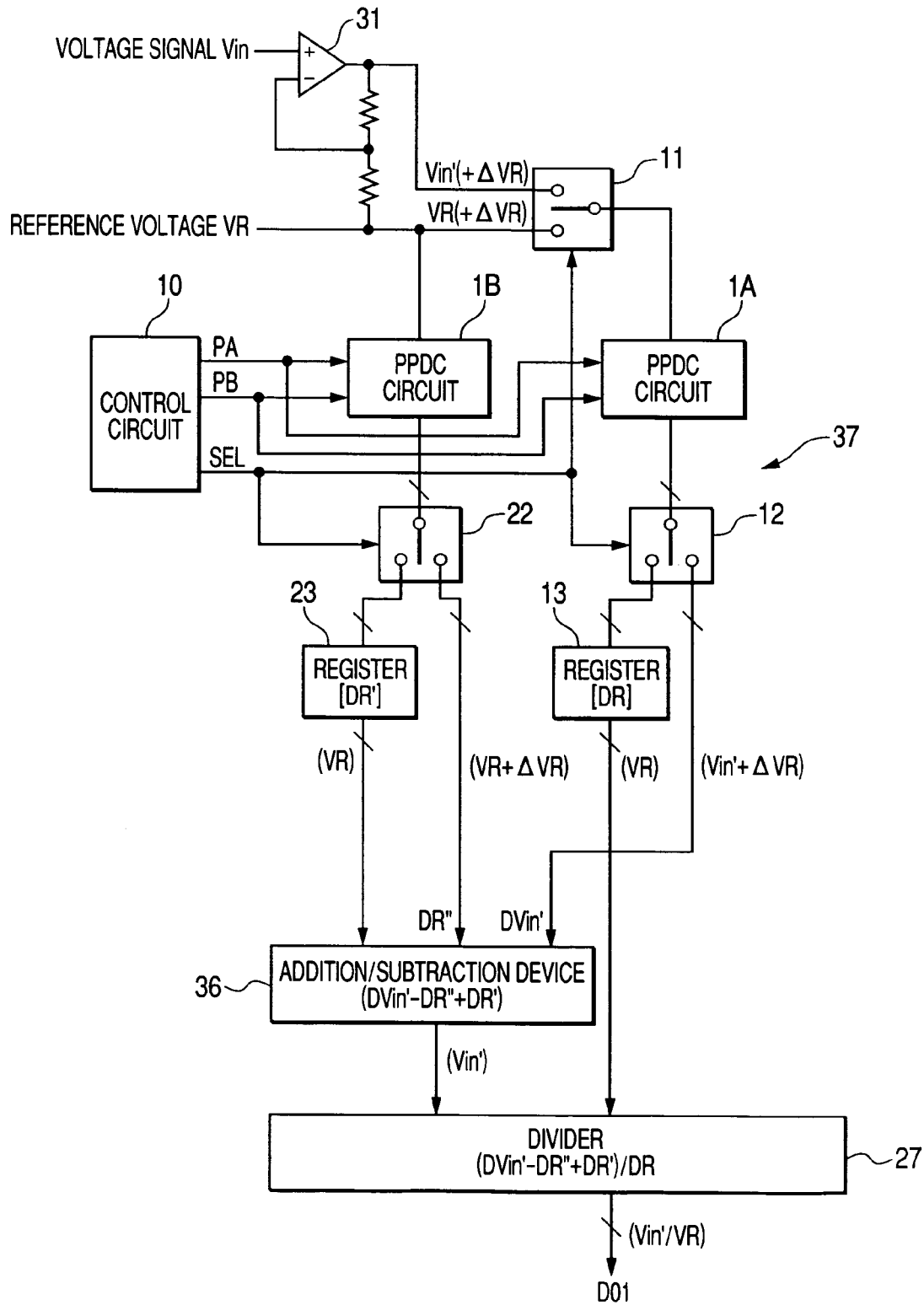
FIG. 7 is a block diagram showing a structure of an A/D converter according to a fourth embodiment of the invention.

FIG. 7 is a block diagram showing a structure of an A/D converter 37 according to a fourth embodiment of the invention. The fourth embodiment is a combination of the second embodiment and the third embodiment. The fourth embodiment is different from the third embodiment in that the four the embodiment uses, instead of the subtraction/addition device 34, a subtraction/addition device (variation compensation circuit) 36 performing the calculation of (DVin'−(DR"−DR'))=(DVin'−DR"DR'). Except for the above, the first embodiment operates in the same way as the third embodiment.

In the fourth embodiment, the data set DVin' A/D-converted by the PPDC circuit 1A, and the data set DR" A/D-converted by the PPDC circuit 1B are directly sent to the subtraction/addition device 36. Accordingly, the fourth embodiment can be made simpler than the second embodiment in structure

Fifth Embodiment

Figure 8:
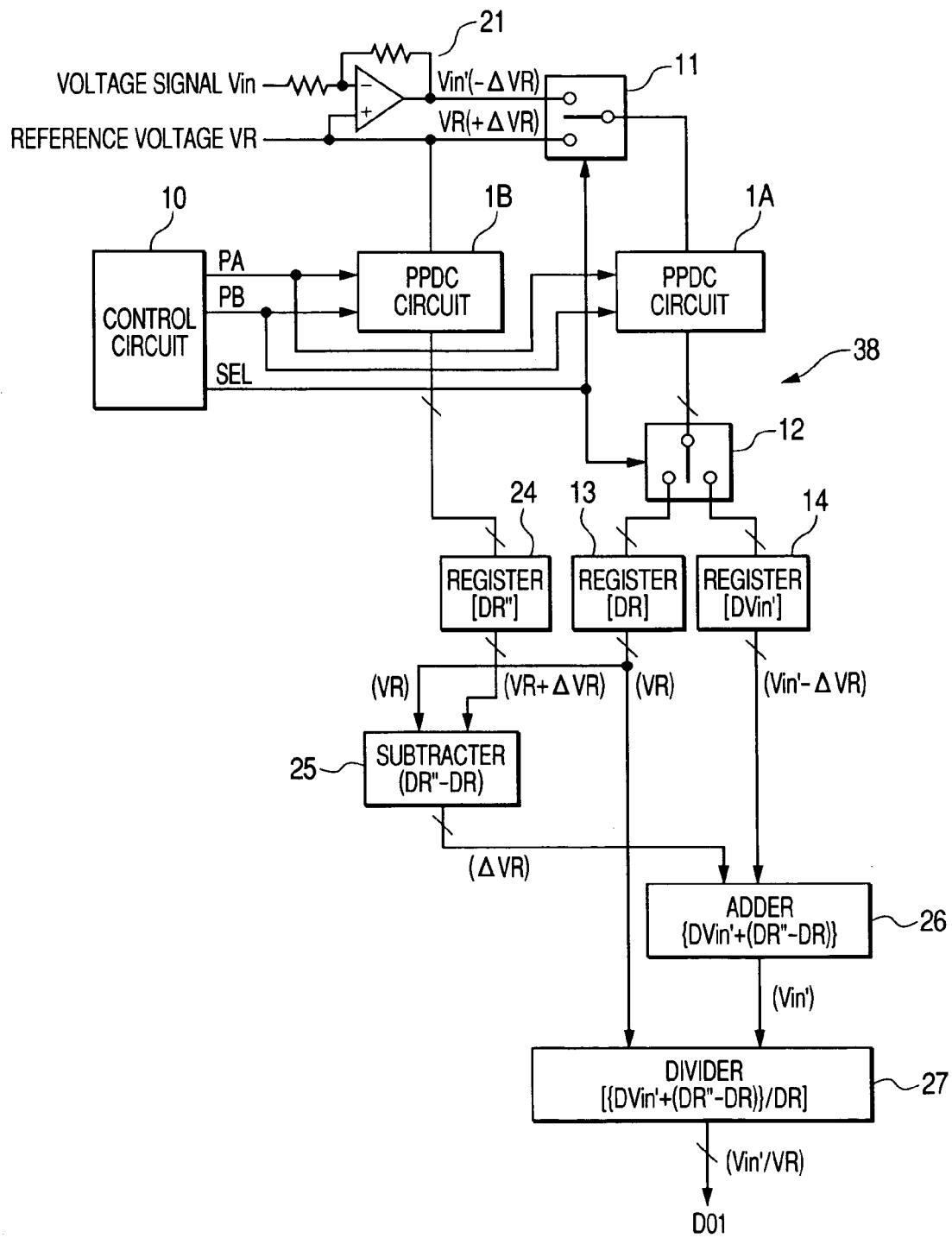
FIG. 8 is a block diagram showing a structure of an A/D converter according to a fifth embodiment of the invention.

FIG. 8 is a block diagram showing a structure of an A/D converter 38 according to a fifth embodiment of the invention. The fifth embodiment is different from the first embodiment in that the selection switch 22 and the register 23 on the output side of the PPDC circuit 1B are eliminated, and the data set DR latched in the register 13 is supplied to the subtracter 25 as a subtrahend.

In the first embodiment, the data set DR' stored in the register 23 and the data set DR stored in the register 13 are data sets obtained by A/D-converting the same reference voltage VR at the same time period. Accordingly, by using the data set DR stored in the register 13 as a subtrahend of the subtraction performed by the subtracter 25, the structure of the A/D converter can be made simpler.

Sixth Embodiment

Figure 9:
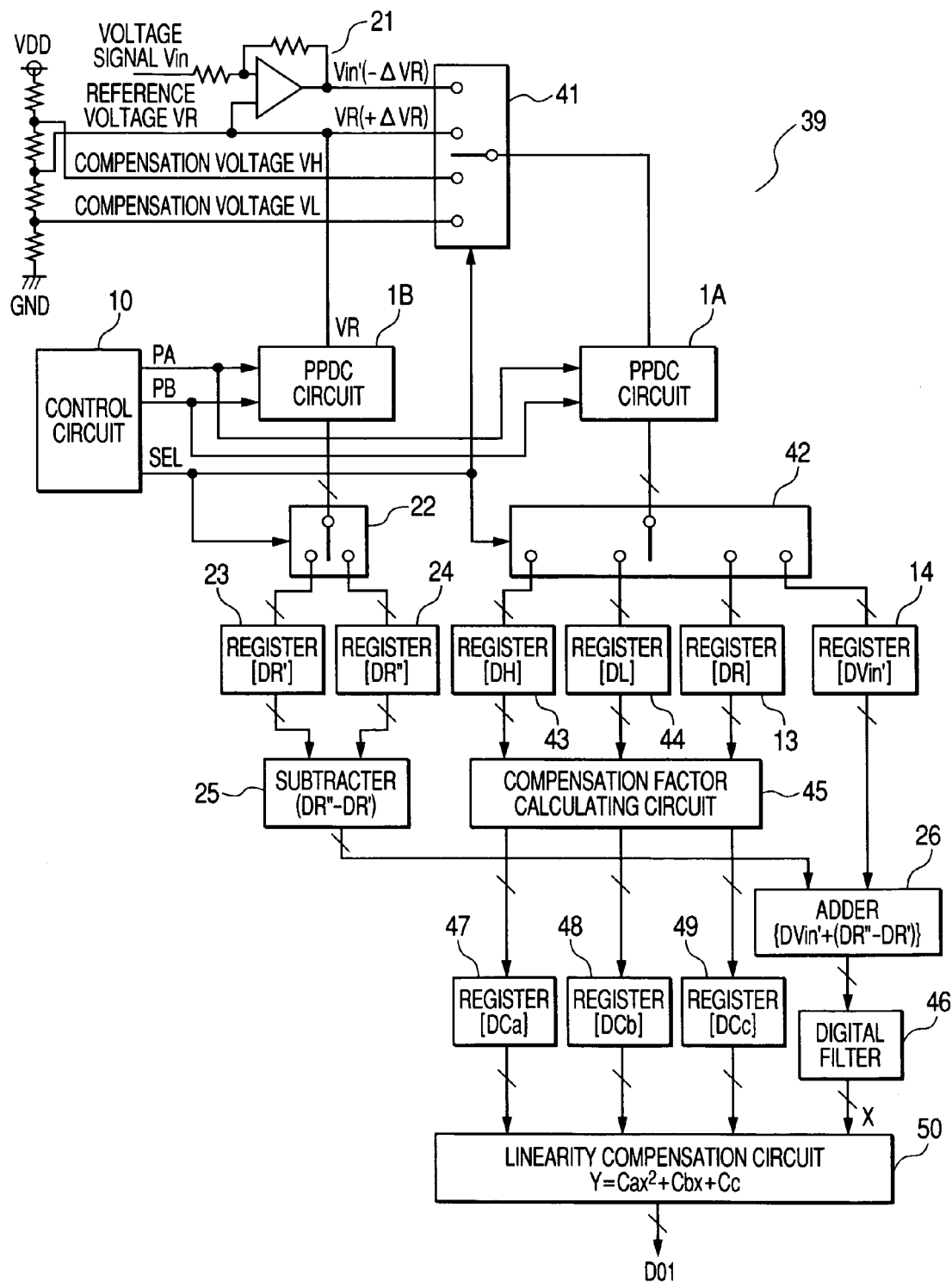
FIG. 9 is a block diagram showing a structure of an A/D converter according to a sixth embodiment of the invention.

FIG. 9 is a block diagram showing a structure of an A/D converter 39 according to a sixth embodiment of the invention. The sixth embodiment is configured to perform a second-order compensation on the A/D-converted data sets of the analog voltage signal Vin' for compensating for non linearity of the PPDC circuit 1A by making use of the reference voltage VR, a high compensation voltage VH and a low compensation voltage VL.

As shown in FIG. 9, in the sixth embodiment, the input selection switch 11 and the output selection switch 12 are replaced by an input selection switch 41 and an output selection switch 42, respectively. And the sixth embodiment is additionally provided with registers 43, 44 for latching data sets DH, DL obtained by A/D-converting the high compensation voltage VH and the low compensation voltage VL, a compensation factor calculating circuit 45, registers 47, 48, 49 for storing calculated compensation factors Ca, Cb, Cc, respectively a digital low-pass filter 46 enabling outputting, with high resolution, the result of the addition performed by the adder 26, and a nonlinearity compensation circuit 50 for performing the second-order compensation on the output of the digital filter 46 by use of the compensation factors stored in the registers 47, 48, 49.

Figure 10:
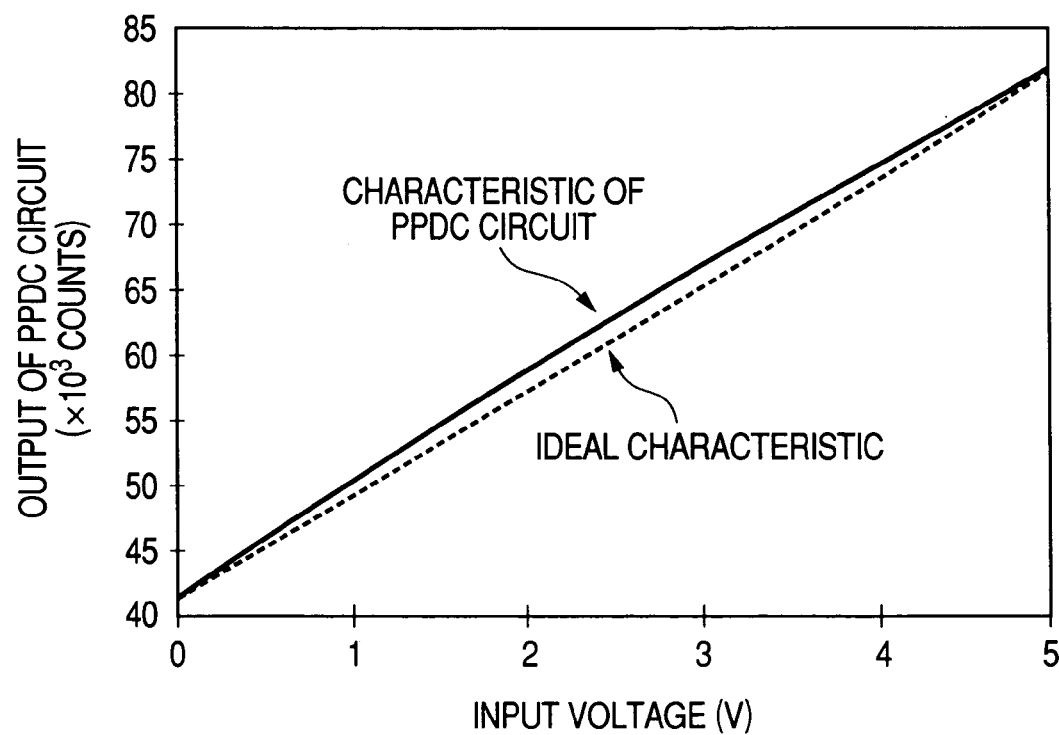
FIG. 10 is a graph for explaining deviation between an input-output characteristic or A/D conversion characteristic of the pulse-phase-difference coding circuit from an ideal characteristic.

As shown in FIG. 10, the PPDC circuit has its own inherent input-output characteristic or A/D conversion characteristic represented by a solid curved line deviating from an ideal characteristic represented by a straight broken line. The A/D converter 39 according to the sixth embodiment of the invention having the digital filter 46 and configured to compensate for such deviation can perform A/D conversion with higher precision and accuracy compared to the first embodiment.

Although the PPDC circuit is constituted by an odd number of delay gates in the above described first to sixth embodiments, it is possible to constitute the PPDC circuit by an even number of delay gates.

Although the gain of the inverting amplifier and the non-inverting amplifier is one in the above described first to sixth embodiments, it may be set at a value different from one according to design conditions.

It is possible to apply the structure of the fifth embodiment to each of the second to fourth embodiments.

Seventh Embodiment

Figure 11:
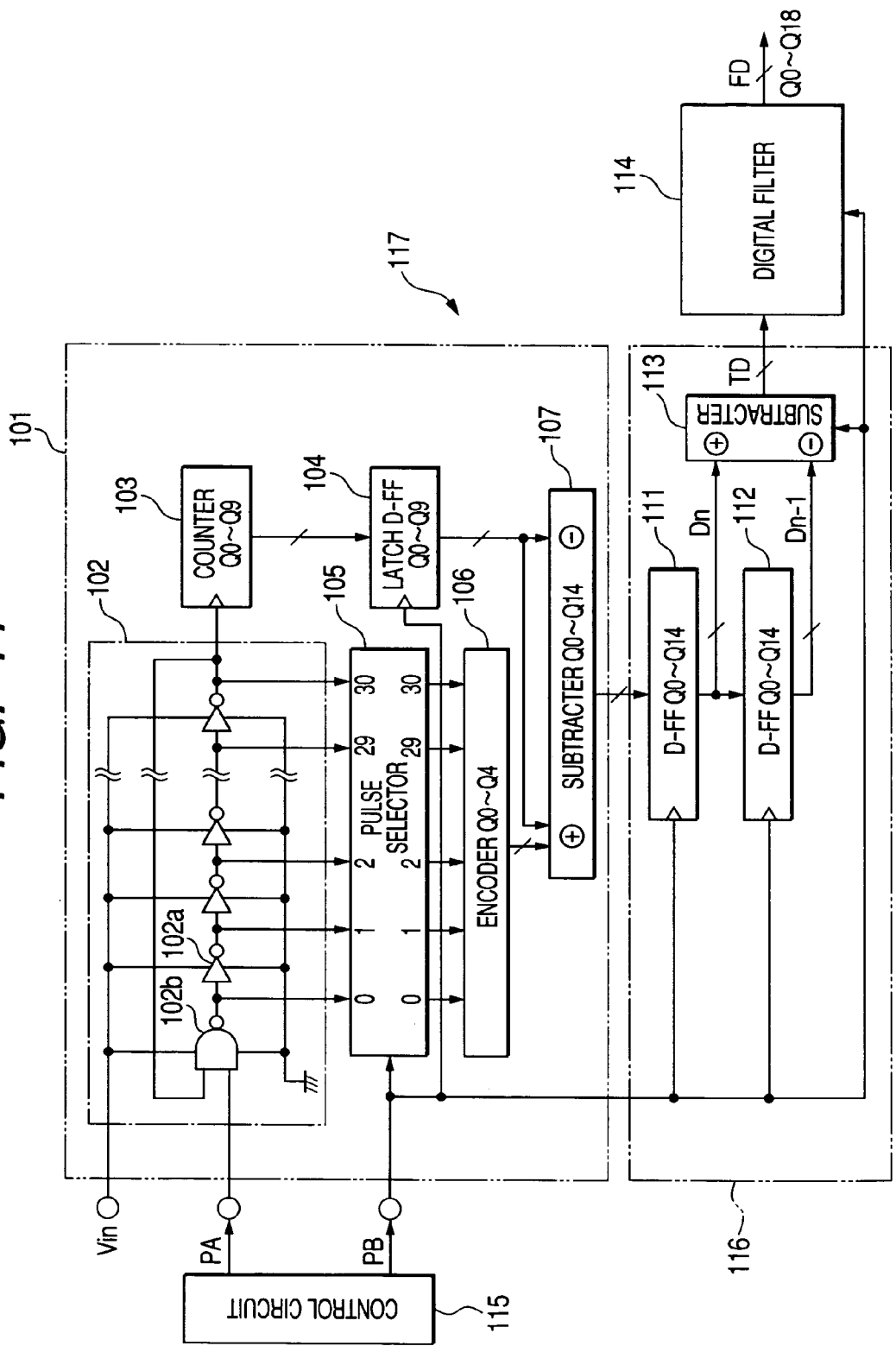
FIG. 11 is a block diagram showing a structure of an A/D converter according to a seventh embodiment of the invention.

FIG. 11 is a block diagram showing a structure of an A/D converter 117A according to a seventh embodiment of the invention. This A/D converter includes a PPDC circuit 101, a control circuit 115, a digital filter 114, and a differential data set calculating device 116.

The PPDC circuit 101 includes a ring delay line 102, a counter 103, a latch circuit (D flip-flop) 104, a pulse selector 105, an encoder 106, and a subtraction circuit 107. The pulse selector 105 and the encoder 106 serve as a device for detecting a position of a pulse circulating in the ring delay line 102.

The ring delay line 102 is constituted by an odd number (31, in this embodiment) of delay gates including inverting gates 102a and a NAND gate 102b connected in the form of a ring. The ring delay line 102 begins an oscillation action (pulse signal circulating action) upon receiving a sampling control signal PA from a control circuit 115 at one input terminal of the NAND gate 102b. The counter 103, which may be a 10-bit counter, counts the number of times (N) that the pulse signal circulating in the ring delay line 102 has traveled around this ring delay line 102, and the counted number is latched into the latch circuit 104 as a binary digital signal when the control circuit 115 outputs a sampling control signal PB. The pulse selector 105 generates a signal representing a position of the pulse signal circulating in the ring delay line 102. The encoder 106 generates a binary digital signal (5-bit signal, for example) corresponding to the signal outputted from the pulse selector 105. The subtraction circuit 107 combines the binary digital signal received from the latch circuit 104 as higher-order bits and the binary digital signal received from the encoder 106 as lower-order bits.

In this embodiment, since the ring delay line 102 is constituted by an odd number (31) of delay gates, the actual phase difference between the sampling control signal PA and the sampling control signal PB is less, by a value equal to a resolution td of the ring delay line 102 (the delay time of one delay gate) multiplied by the number of times (N) that the pulse signal circulating in the ring delay line 102 has traveled around this ring delay line 102, than the value represented by the 15-bit signal (the combination of binary digital signal received from the latch circuit 104 as higher-order bits and the binary digital signal received from the encoder 106 as lower-order bits).

Accordingly, the subtraction circuit 107 subtracts, from the 15-bit signal, the 5-bit signal being shifted to LSB position. The result of the subtraction is outputted as a digital data set (15-bit signal) representing the measured phase difference between the sampling control signal PA and the sampling control signal PB.

The differential data set calculating device 116 includes latch circuits 111 and 112, and a subtraction circuit 113.

Figure 12A:
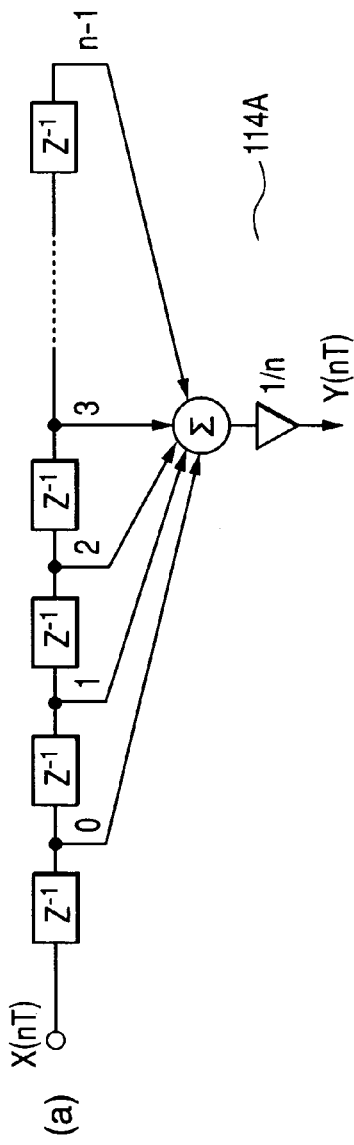
FIGS. 12A, 12B and 12C are block diagrams showing structures of a moving average filter, an FIR filter and an IIR filter, respectively, used as a digital filter in the A/D converter according to the seventh embodiment.
Figure 12B:
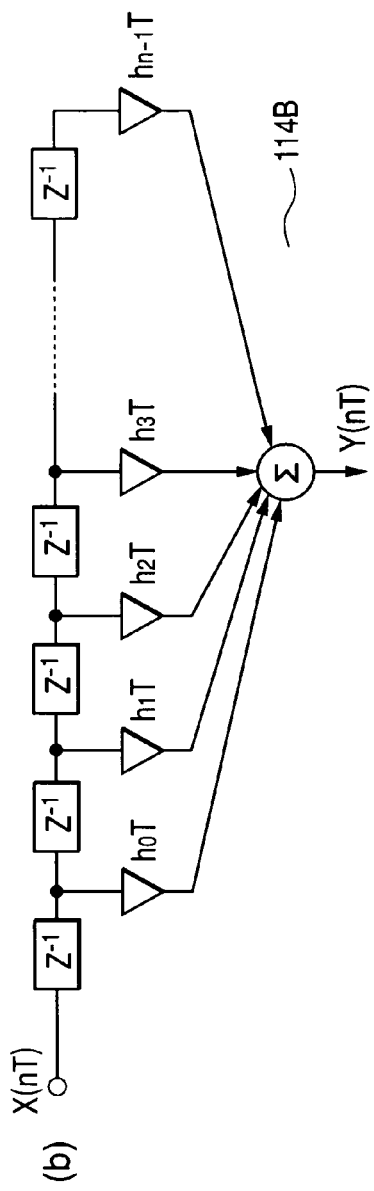
Figure 12C:
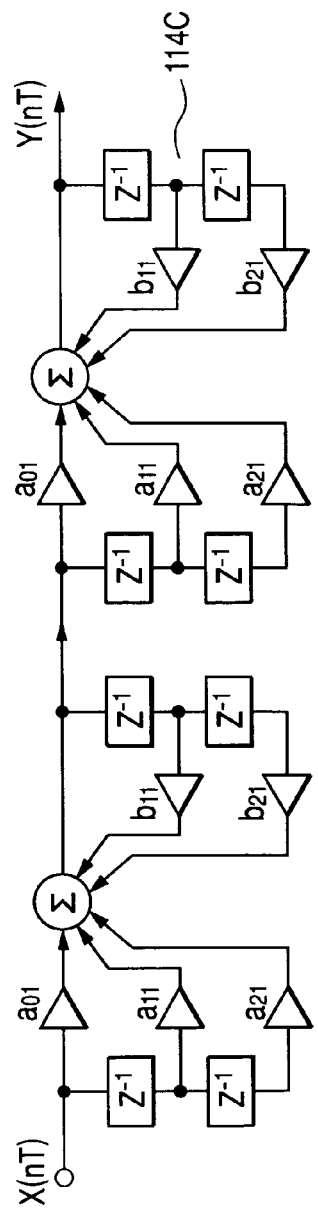

Next, the structure of the digital filter 114 is explained. The digital filter 114 may be any type of a low-pass filter as long as it allows a signal within an intended frequency band to pass. Accordingly, as the digital filter 114, an n-order moving average filter 114A as shown in FIG. 12A, an n-order FIR (Finite Impulse Response) filter 114B as shown in FIG. 12B, or a four-order IIR (Infinite Impulse Response) filter 114C constituted by two cascaded 2-order IIR filters as shown in FIG. 12C may be used. However, in this embodiment, the IIR filter 114c is used as the digital filter 114 for the reason set forth later.

Figure 13:
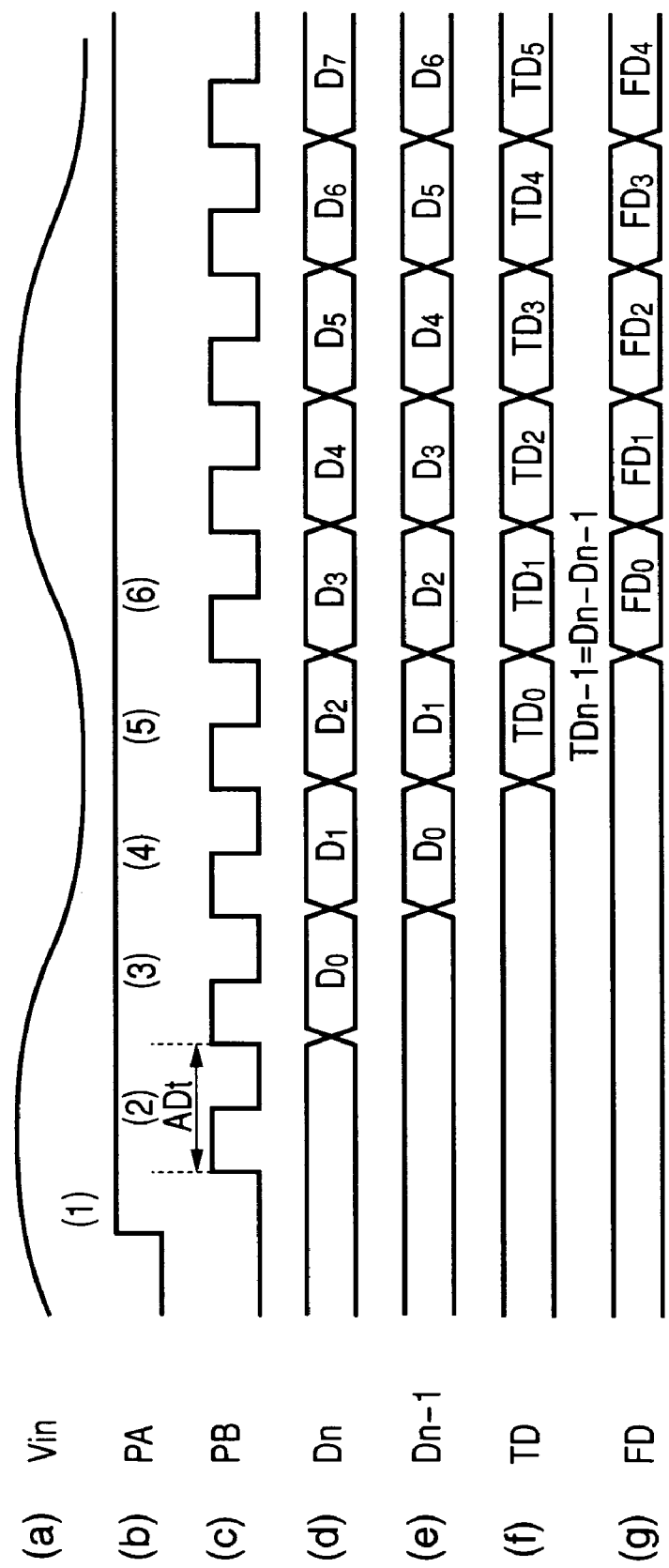
FIG. 13 is a timing chart of signals within the A/D converter according to the seventh embodiment.

Next, the operation of the A/D converter 117 according to the seventh embodiment is explained with reference to FIGS. 13 to 15. FIG. 13 is a timing chart of various signals within the A/D converter 117. For A/D-converting the analog voltage signal Vin ((a) in FIG. 13), the control circuit 115 makes the sampling control signal PA active (high level, for example) at timing (1) so that the ring delay line (pulse-circulating circuit) 102 starts the pulse-circulating operation ((b) in FIG. 13), and at timing (2), outputs the sampling control signal PB ((c) in FIG. 13) with constant periodicity so that the A/D converting operation is performed continuously.

The latch circuit 111 latches a first A/D conversion result D0 at timing (3), and latches a second A/D conversion result D1 at timing (4) ((d) in FIG. 13). The latch circuit 112 latches the first A/D conversion result D0 at timing (4) ((e) in FIG. 13). At timing (S), the subtraction circuit 13 outputs a first subtraction result TD0 ((f) in FIG. 13). At timing (6), the digital filter 114 outputs first data set FD0 ((f) in FIG. 13). The data set TDn−1=Dn−Dn−1 which the subtraction circuit 113 outputs is a data set that represents the number of times that the pulse circulating in the ring delay line 102 has traveled around this ring delay line during the sampling time ADt and also the position of this pulse signal within the ring delay line 102.

The ring delay line 102 continues to operate from the time when the sampling control signal PA becomes active, and the PPDC circuit 101 outputs a data set representing progress of the pulse circulation movement at each lapse of the sampling time ADt. For example, as shown in FIG. 14, a sum total of 10 consecutive sampled data sets (A/D-converted data sets) when the sampling time ADt is set at 1 µs is equivalent to one sampled data set when the sampling time ADt is set at 10 µs. And a sum total of two consecutive sampled data sets when the sampling time ADt is set at 10 µs is equivalent to one sampled data set when the sampling time ADt is set at 20 µs (see (a), (b), (c) in FIG. 14). As explained above, the A/D-converted data sets outputted from the PPDC circuit 101 have continuity.

In the prior art A/D converters aforedescribed having the PPDC circuit but not provided with any differential data set calculating device and digital filter, if the A/D conversion resolution is 16 bits when the sampling time is 10 µs, it reduces to about 13 bits when the sampling time is shortened to 1 µs. In the A/D converter 117 of this embodiment, the sum total of 10 consecutive A/D-converted data sets when the sampling time is 1 µs is equivalent to one A/D-converted data set when the sampling time is 10 µs.

It means that the sampled data set obtained when the sampling time is set at 1 µs constitutes part of the A/D-converted data set having a resolution of 16 bits. In other words, a sampled data set (A/D-converted data set) obtained when the sampling time is set at 1 µs includes information about a sampled data set having 16-bit resolution. Accordingly, by low-pass filtering, in synchronization with the output cycle of the sampling control signal PS, the sampled data sets TD0, TD1, TD2, . . . obtained when the sampling time is set at 1 µs by use of the digital filter 114, they can be combined into the A/D-converted data set FD having higher resolution as a consequence of the signal integration effect of the digital filter 114.

To produce an A/D-converted data set having resolution of not less than 16 bits from sampled data sets obtained when the sampling time is set at 1 µs, it is necessary for the digital filter 114 to have signal integration effect equivalent to at least 10 µs. Therefore, if the moving average filter 114A shown in FIG. 12A, or the FIR filter 114B shown in FIG. 12B is used as the digital filter 114, their filter orders have to be at least 10. On the other hand, if the IIR filter 114C shown in FIG. 12C is used as the digital filter 114, the filter order may be as small as 2, because the effect of a past input signal lasts longer.

Figure 15A:
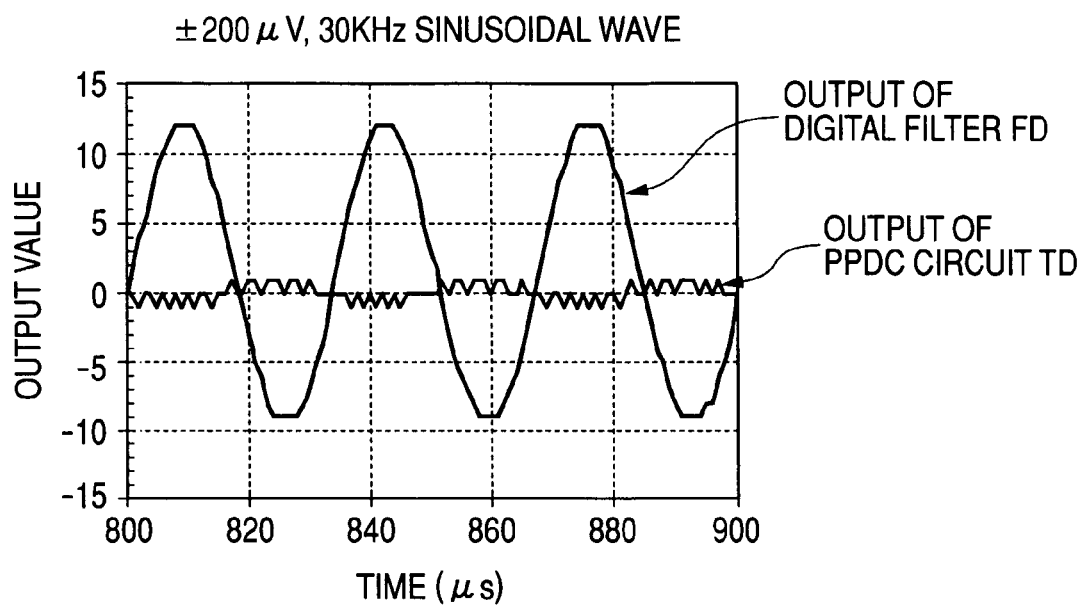
FIGS. 15 A and 15B are graphs showing output waveforms of a pulse-phase-difference coding circuit and a digital filter of the A/D converter according to the seventh embodiment.
Figure 15B:
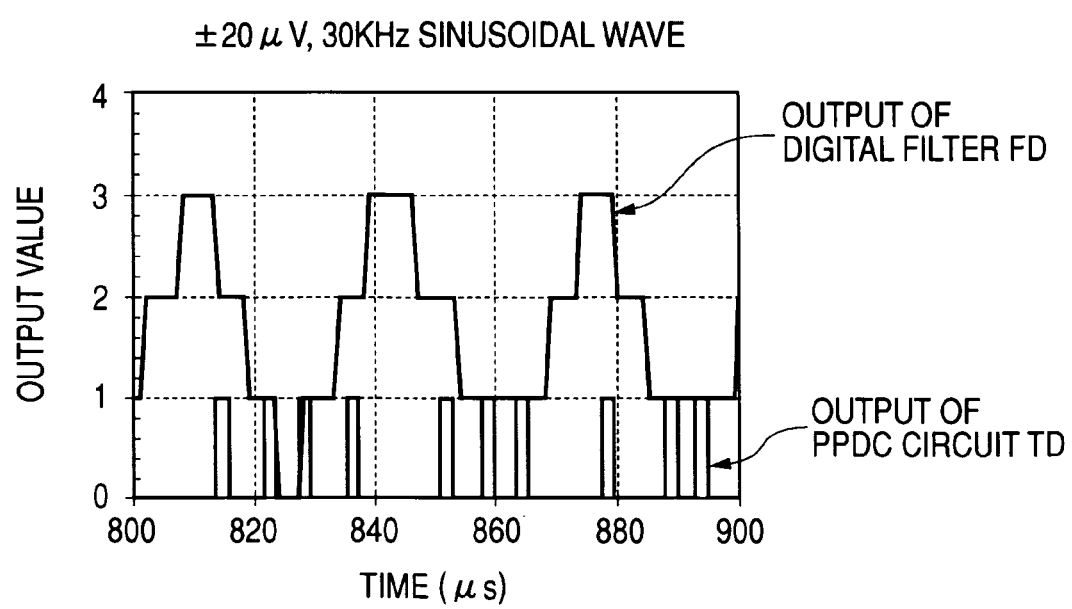

FIGS. 15A and 15B are graphs showing output waveforms of the PPDC circuit 101 and the digital filter 114 obtained by mathematical calculations. FIG. 15A shows a case where a sinusoidal voltage having amplitude of ±200 µV and frequency of 30 kHz is used as the analog voltage signal Vin. As shown in this figure, although the data set TD outputted from the subtraction circuit 113 of the differential data set calculating device 116 has a magnitude equivalent to 2 counts, the data set FD outputted from the digital filter 114 has a magnitude equivalent to 21 counts. The data set FD has resolution of about 19 µV/count. FIG. 15B shows a case where a sinusoidal voltage having amplitude of ±20 µV and frequency of 30 kHz is used as the analog voltage signal Vin. In this case, although the data set TD outputted from the subtraction circuit 113 has a magnitude equivalent to 1 count, the data set FD outputted from the digital filter 114 has a magnitude equivalent to 2 to 3 counts.

As explained above, the seventh embodiment is configured such that the control circuit 115 causes the ring delay line 102 to operate for starting the A/D converting operations, and thereafter samples the outputs of the counter 103 and the encoder 106 periodically. The differential data set representing the difference between two sampled data sets obtained by two consecutive A/D converting operations is filtered by the digital filter 114. With such a configuration, it is possible to convert the analog voltage signal vin into a digital signal with high precision even when the sampling time is shortened for speeding up the A/D converting operations.

Furthermore, the control circuit 115 controls the latch circuit 111, 112 connected in series to successively latch the data sets outputted from the PPDC circuit 101 at the same timings at which the control circuit 115 causes the PPDC circuit 101 to sample the voltage signal vin, and the subtraction circuit 113 performs subtractions between the data set latched in the latch circuit 111 and the data set latched in the latch circuit 112. Accordingly, the subtraction circuit 107 can perform, well in advance, the operation of combining the binary digital signal received from the encoder 106 and the binary digital signal received from the counter 103, and the subsequent subtraction.

Furthermore, the IIR filter 114C is used as the digital filter 114 in this embodiment. By using the IIR filter 114C having a configuration in which output signal is fed back and accordingly the effects of the past input signals last long, it becomes possible to reduce the circuit scale of the A/D converter 117, because the digital filter 114 may have a relatively low filter order.

Eighth Embodiment

Figure 16:
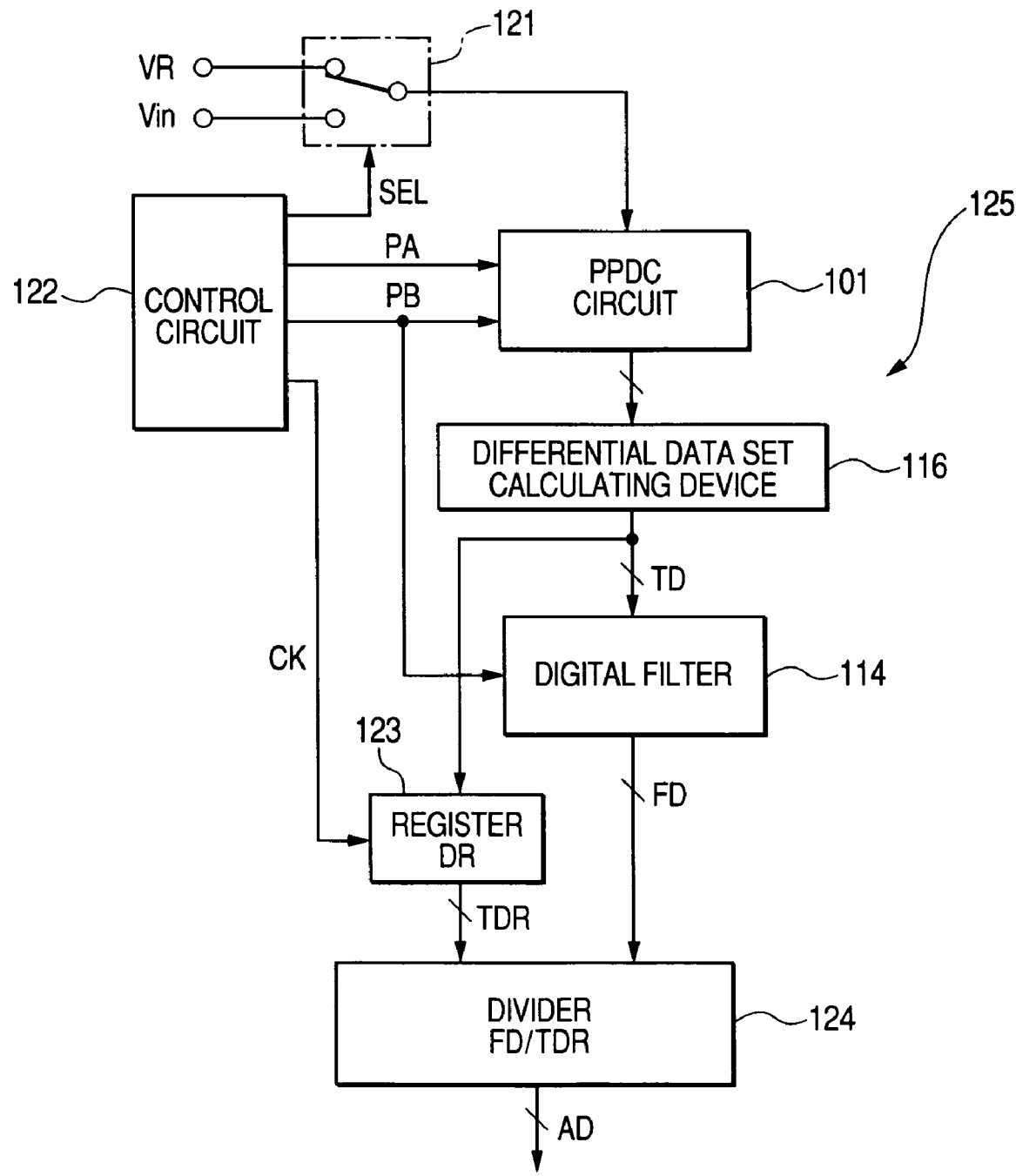
FIG. 16 is a block diagram showing a structure of an A/D converter according to an eighth embodiment of the invention.

FIG. 16 is a circuit diagram showing a structure of an A/D converter 125 according to an eighth embodiment of the invention. In FIG. 16, the elements that are the same as those shown in FIG. 11 are given the same reference characters, and explanation thereof will be omitted.

The structure of the eighth embodiment is a combination of the structure of the A/D converter disclosed in the aforementioned Japanese Patent application Laid-open No. 5-259907 and the structure of the above described seventh embodiment. That is, the A/D converter 125 has an input selection switch 121 at an input side of the PPDC circuit 101, a control circuit 122 that outputs the selection signal SEL in accordance with which the input selection switch 121 selects one of the analog voltage signal Vin and the reference voltage VR. The input selection switch 121 selects the reference voltage VR first, and then selects the analog voltage signal Vin. The PPDC circuit 101 outputs the A/D-converted data set DR of the reference voltage VR and the A/D-converted data set DVin of the analog voltage signal Vin. The differential data set calculating device 116 outputs, as a data set TD, the difference between these data sets to the digital filter 114.

Figure 17:
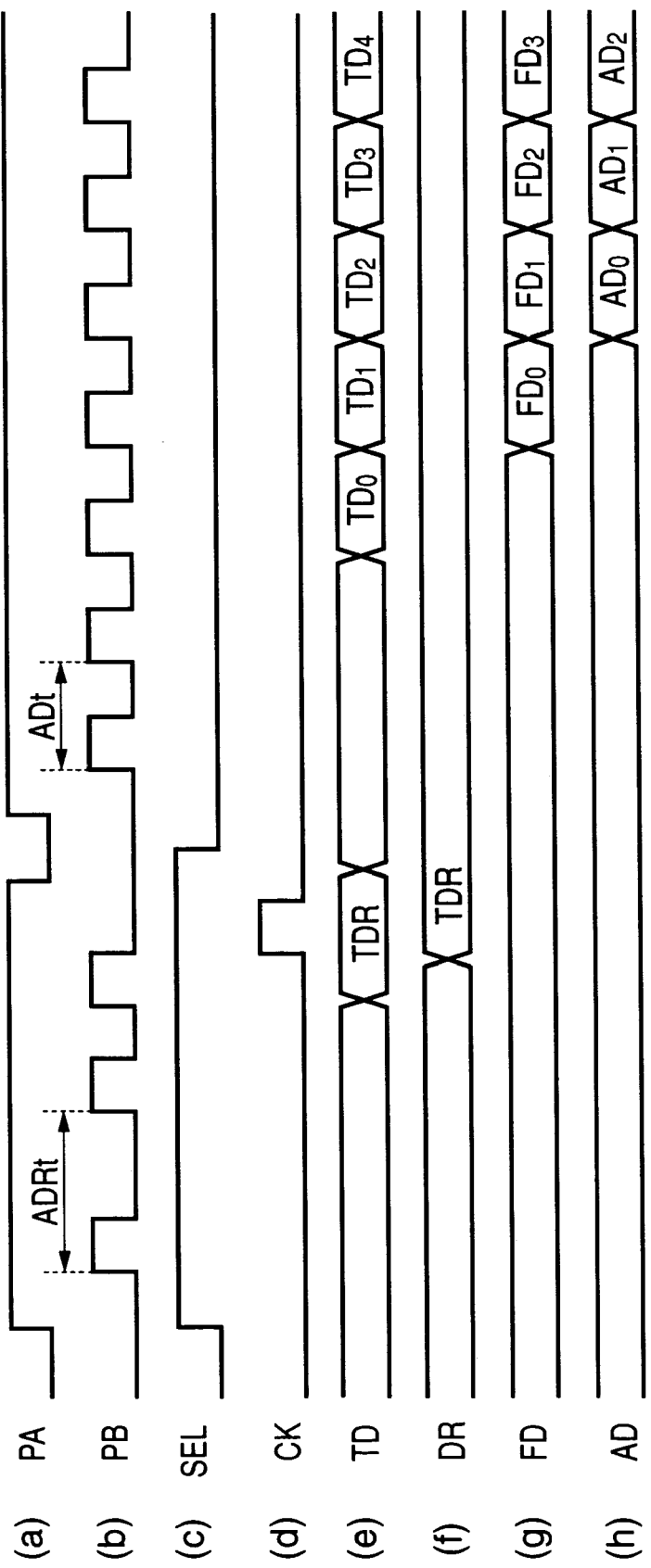
FIG. 17 is a timing chart of signals within the A/D converter according to the eighth embodiment.

The data set DR is also latched in a register 123 as a data set TDR at the timing defined by a latch timing signal CK received from the control circuit 122 ((d) in FIG. 17). The divider 124 divides the output data set FD from the digital filter 114 by the data set TDR stored in the register 123, and outputs the result of the division (FD/TDR) as the A/D-converted data set of the analog voltage signal Vin ((h) in FIG. 17).

Since the A/D-converted reference voltage VR is supplied to the divider 124 as the data set TDR not through the digital filter 114, the control circuit 122 can lengthen the sampling time ADRt when A/D-converting the reference voltage VR to the extent that the data set TDR has the same resolution as the data set FD outputted from the digital filter 114 ((b) in FIG. 17). For example, in a case where the sampling time ADt is 1 µs, the data set TD outputted from the differential data set calculating device 116 has a 15-bit length, and the data set FD outputted from the digital filter 114 having capability of improving resolution of an input data set by 4 bits has a 19-bit length, the sampling time ADRt is set at 16 µs. That is, the sampling time is lengthened by 16 times to obtain resolution improvement equivalent to 4 bits.

As explained above, the eights embodiment of the invention is configured such that the PPDC circuit 101 is applied with selected one of the reference voltage VR and the analog voltage signal Vin, and the A/D-converted data set of the reference voltage VR outputted from the PPDC circuit 101 when the reference voltage VR has been selected is stored in the register 123. And when the analog voltage signal Vin is selected subsequently, the digital filter 114 outputs the data set FD to the divider 124 where it is divided by the data set stored in the register 123.

Accordingly, if the data set FD is varied when the inverting times of the inverting gates 102a vary due to ambient temperature variation, the variation of the data set FD can be set off at the divider 124, because the data set TDR corresponding to the reference voltage VR also varies likewise. Thus, with the eighth embodiment, it is possible to obtain a high-resolution A/D-converted data set of the analog voltage signal Vin not affected by ambient temperature variation.

Furthermore, since the A/D-converted data set of the reference voltage VR does not pass through the digital filter 114, and is directly sent to the register 123, the sampling time when A/D-converting the reference voltage VR can be set longer, so that the A/D-converted data set of the reference voltage VR has the same resolution as the A/D-converted data set of the analog voltage signal Vin outputted from the digital filter 114.

Ninth Embodiment

Figure 18:
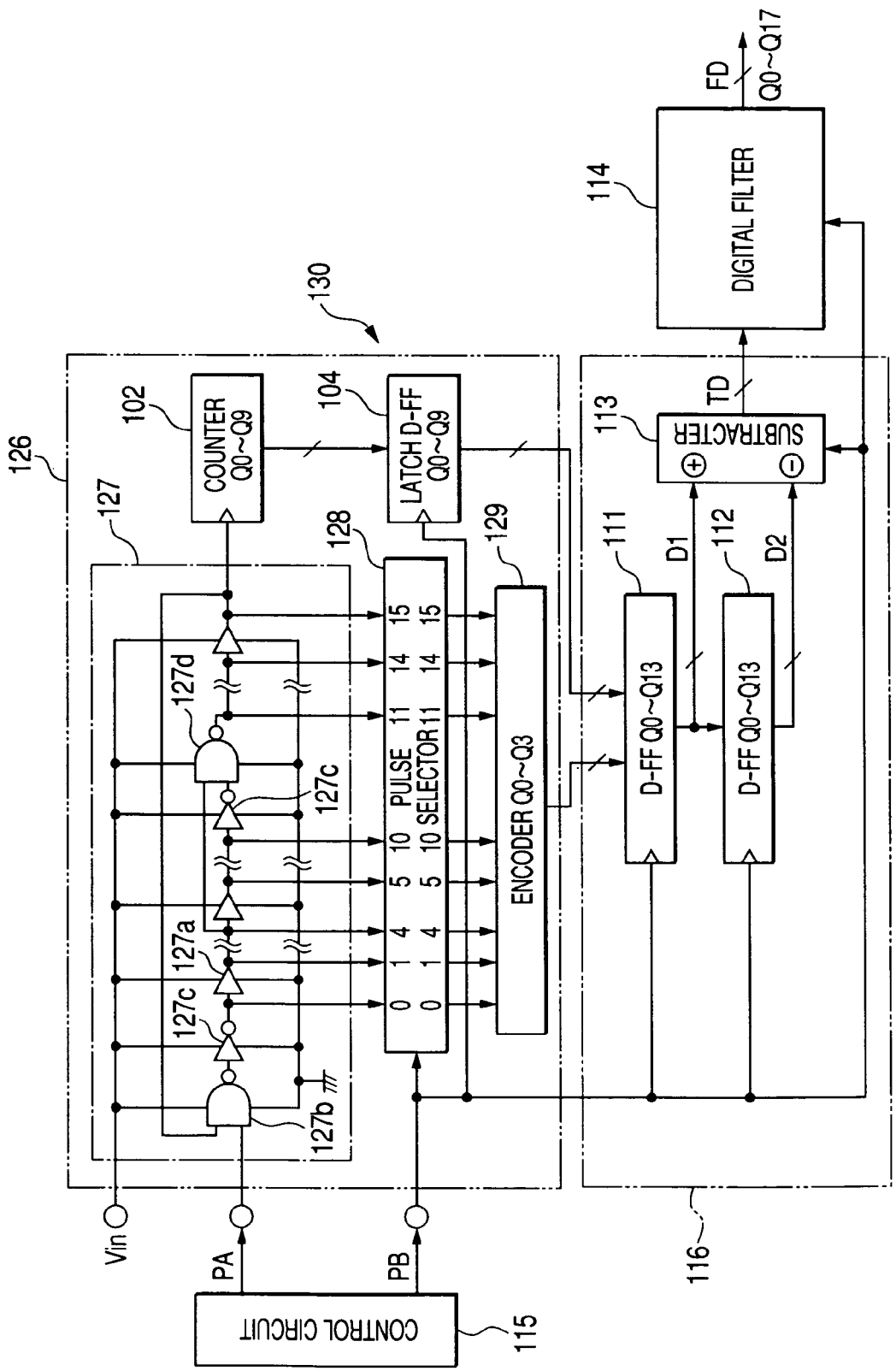
FIG. 18 is a block diagram showing a structure of an A/D converter according to a ninth embodiment of the invention.

FIG. 18 is a block diagram showing a structure of an A/D converter 130 according to a ninth embodiment of the invention. In FIG. 18, the elements that are the same as those showing in FIG. 11 are given the same reference characters, and explanation thereof will be omitted.

The ninth embodiment uses a PPDC circuit 126 instead of the PPDC circuit 101. The PPDC circuit 126 has a ring delay line (pulse circulating circuit) 127 constituted by an even number (16 in this embodiment) of delay buffers (delay gates). The 16 delay buffers include a combination of a first NAND gate 127b and an inverting gate 127c connected to the output of the NAND gate 127b, a combination of a second NAND gate 127d and an inverting gate 127c connected to the input of the NAND gate 127d, and 14 non-inverting buffers 127a each of which is constituted by two inverting gates connected in series. The first NAND gate 127b is used for starting the pulse circulating operation, and the second NAND gate 127d is used for adjusting a duty ratio of the pulse signal circulating in the ring delay line 127. A pulse selector 128 outputs a position signal representing the position of the pulse signal circulating in the ring delay line 127, and an encoder 129 that encodes the position signal to 4-bit digital signal.

In the ninth embodiment, since the ring delay line 127 is constituted by even number of non-inverting buffers, the subtraction circuit 107 used in the seventh and eighth embodiments is unnecessary, and the data set to be latched in the latch circuit 111 may be mere combination of the 10-bit signal outputted from the latch circuit 104 as higher-order bits and the 4-bit signal outputted from the encoder 129 as lower-order bits.

In the above described seventh and eighth embodiments, the output data set from the subtraction circuit 107 of the PPDC circuit 101 may be directly supplied to the subtraction circuit 113 of the differential data set calculating device 116 to eliminate the latch circuit 111.

In each of the above described embodiments, the sampling times and bit configurations at each section of the A/D converter are described only by way of example. They may be determined according to various design conditions.

The present invention is suitable for knock control for vehicle engines. However, the present invention can be used also for detecting ultrasonic signals in a vehicle-mounted clearance sonar.

The above explained preferred embodiments are exemplary of the invention of the present application which is described solely by the claims appended below. It should be understood that modifications of the preferred embodiments may be made as would occur to one of skill in the art.

What is claimed is:

1. An A/D converter for converting an analog voltage signal into a digital signal comprising:
    first and second pulse-phase-difference coding circuits each of which includes:
        a pulse-circulating circuit having a plurality of delay gates connected in a form of a ring, delay times of said delay gates depending on a voltage applied to said delay gates as a power supply voltage thereof;
        a counter outputting a count signal representing the number of times that a pulse circulating in said pulse-circulating circuit has traveled around said pulse-circulating circuit during a sampling time defined by a phase difference between sampling control signals supplied to said pulse-circulating circuit,
        a position signal generating device generating a position signal representing a position of said pulse within said pulse-circulating circuit; and
        a processing circuit outputting a combination of said count signal and said position signal as an A/D-converted data set of said voltage applied to said delay gates;
    an input selection switch which selects a reference voltage during a first time period and selects said analog voltage signal supplied from an amplifier during a second time period in response to a selection signal, said amplifier amplifying said analog voltage signal using said reference voltage as a base potential thereof;
    a control circuit operating to supply said input selection switch with said selection signal so that said first pulse-phase-difference coding circuit is supplied with said reference voltage as said power supply voltage during said first time period and supplied with said analog voltage signal as said power supply voltage during said second time period, to supply said second pulse-phase-difference coding circuit with said reference voltage as said power supply voltage during said first and second time periods, and to supply said pulse-circulating circuits of said first and second pulse-phase-difference coding circuits with said sampling control signals during each of said first and second time periods, a register for storing a first data set outputted from said processing circuit of said first pulse-phase-difference coding circuit as an A/D-converted data set of said reference voltage when said selection switch selects said reference voltage during said first time period;

a variation compensation circuit correcting a second data set outputted from said processing circuit of said first pulse-phase-difference coding circuit as an A/D-converted data set of said analog voltage signal when said input selection switch selects said analog voltage signal during said second time period on the basis of difference between one of said first data set and a third data set outputted from said processing circuit of said second pulse-phase-difference coding circuit as an A/D-converted data set of said reference voltage when said input selection switch selects said reference voltage, and a fourth data set outputted from said processing circuit of said second pulse-phase-difference coding circuit as an A/D-converted data set of said reference voltage when said input selection switch selects said analog voltage signal; and a divider dividing said second data set corrected by said variation compensation circuit by said first data set stored in said register.

2. An A/D converter according to claim 1, wherein said variation compensation circuit is configured to perform subtraction of said first or third data set from said fourth data set, and to correct said second data set by adding or subtracting a result of said subtraction to or from said second data set depending on amplification polarity of said amplifier.

3. An A/D converter according to claim 1, wherein said digital low-pass filter is an IIR filter.

4. A method of converting an analog voltage signal into a digital signal by use of first and second pulse-phase-difference coding circuits each of which includes:

a pulse-circulating circuit having a plurality of delay gates connected in a form of a ring, delay times of said delay gates depending on a voltage applied to said delay gates as a power supply voltage thereof;

a counter outputting a count signal representing the number of times that a pulse circulating in said pulse-circulating circuit has traveled around said pulse-circulating circuit during a sampling time defined by a phase difference between sampling control signals supplied to said pulse-circulating circuit, a position signal generating device generating a position signal representing a position of said pulse within said pulse-circulating circuit; and a processing circuit outputting a combination of said count signal and said position signal as an A/D-converted data set of said voltage applied to said delay gates;

said method comprising the steps of:

supplying said first pulse-phase-difference coding circuit with a reference voltage as said power supply voltage during a first time period and with an analog voltage signal outputted from an amplifier as said power supply voltage during a second time period, while supplying said second pulse-phase-difference coding circuit with said reference voltage as said power supply voltage during said first and second time periods, said amplifier using said reference voltage as a potential base thereof;

supplying said first and second pulse-phase-difference coding circuits with said sampling control signals during each of said first and second time periods, storing, in a register, a first data set outputted from said processing circuit of said first pulse-phase-difference coding circuit as an A/D-converted data set of said reference voltage when said pulse-phase-difference coding circuit is supplied with said reference voltage as said power supply voltage during said first time period;

correcting a second data set outputted from said processing circuit of said first pulse-phase-difference coding circuit as an A/D-converted data set of said analog voltage signal when said first pulse-phase-difference coding circuit is supplied with said analog voltage signal as said power supply voltage on the basis of difference between one of said first data set and a third data set outputted from said processing circuit of said second pulse-phase-difference coding circuit as an A/D-converted data set of said reference voltage when said first pulse-phase-difference coding circuit is supplied with said reference voltage as said power supply voltage, and a fourth data set outputted from said processing circuit of said second pulse-phase-difference coding circuit as an A/D-converted data set of said reference voltage when said first pulse-phase-difference coding circuit is supplied with said analog voltage signal as said power supply voltage; and dividing said second data set corrected by said first data set stored in said register.

5. A method of converting an analog voltage signal into a digital signal according to claim 4, wherein said step of correcting said second data includes performing subtraction of said first or third data set from said fourth data set, and adding or subtracting a result of said subtraction to or from said second data set depending on amplification polarity of said amplifier.

6. An A/D converter for converting an analog voltage signal into a digital signal comprising:

first and second pulse-phase-difference coding circuits each of which includes:

a pulse-circulating circuit having a plurality of delay gates connected in a form of a ring, delay times of said delay gates depending on a voltage applied to said delay gates as a power supply voltage thereof;

a counter outputting a count signal representing the number of times that a pulse circulating in said pulse-circulating circuit has traveled around said pulse-circulating circuit during a sampling time defined by a phase difference between sampling control signals supplied to said pulse-circulating circuit, a position signal generating device generating a position signal representing a position of said pulse within said pulse-circulating circuit; and a processing circuit outputting a combination of said count signal and said position signal as an A/D-converted data set of said voltage applied to said delay gates;
an input selection switch which selects, in response to a selection signal, one of a reference voltage, a high compensation voltage higher than said reference voltage, a low compensation voltage lower than said reference voltage, and said analog voltage signal which is supplied from an amplifier, said amplifier amplifying said analog voltage signal using said reference voltage as a base potential thereof;
a control circuit operating to supply said input selection switch with said selection signal so that said first pulse-phase-difference coding circuit is supplied, as said power supply voltage, with said reference voltage, said high compensation voltage, said low compensation voltage, and said analog voltage signal in an alternating sequence, to supply said second pulse-phase-difference coding circuit with said reference voltage as said power supply voltage continuously, and to supply said pulse-circulating circuits of said first and second pulse-phase-difference coding circuits with said sampling control signals so that said first pulse-phase-difference coding circuit outputs A/D-converted data sets of said reference voltage, said high compensation voltage, said low compensation voltage and said analog voltage signal in an alternating sequence, and that said second pulse-phase-difference coding circuit outputs a first A/D-converted data set of said reference voltage when said first pulse-phase-difference coding circuit is supplied with said reference voltage, and a second A/D-converted data set of said reference voltage when said first pulse-phase-difference coding circuit is supplied with said analog voltage signal,
a variation compensation circuit correcting said A/D-converted data set of said analog voltage signal outputted from said first pulse-phase-difference coding circuit on the basis of difference between said first and second A/D-converted data sets outputted from said second pulse-phase-difference coding circuit; and
a nonlinearity compensation device that determines three compensation factors from said A/D-converted data sets of said reference voltage, said high compensation voltage and said low compensation voltage outputted from said first pulse-phase-difference coding circuit, and corrects said A/D-converted data set of said analog voltage signal by performing a second-order compensation using said three compensation factors to compensate for non linearity of said first pulse-phase-difference coding circuit.

7. A method of converting an analog voltage signal into a digital signal by use of first and second pulse-phase-difference coding circuits each of which includes:
a pulse-circulating circuit having a plurality of delay gates connected in a from of a ring, delay times of said delay gates depending on a voltage applied to said delay gates as a power supply voltage thereof;
a counter outputting a count signal representing the number of times that a pulse circulating in said pulse-circulating circuit has traveled around said pulse-circulating circuit during a sampling time defined by a phase difference between sampling control signals supplied to said pulse-circulating circuit,
a position signal generating device generating a position signal representing a position of said pulse within said pulse-circulating circuit; and
a processing circuit outputting a combination of said count signal and said position signal as an A/D-converted data set of said voltage applied to said delay gates;
said method comprising the steps of:
supplying, as said power supply voltage, said first pulse-phase-difference coding circuit with, in an alternating sequence, a reference voltage, a high compensation voltage higher than said reference voltage, a low compensation voltage lower than said reference voltage and said analog voltage signal which is supplied from an amplifier, said amplifier amplifying said analog voltage signal using said reference voltage as a base potential thereof, while supplying said second pulse-phase-difference coding circuit with said reference voltage as said power supply voltage continuously;
supplying said pulse-circulating circuits of said first and second pulse-phase-difference coding circuits with said sampling control signals so that said first pulse-phase-difference coding circuit outputs A/D-converted data sets of said reference voltage, said high compensation voltage, said low compensation voltage and said analog voltage signal in an alternating sequence, and said second pulse-phase-difference coding circuit outputs a first A/D-converted data set of said reference voltage when said first pulse-phase-difference coding circuit is supplied with said reference voltage, and a second A/D-converted data set of said reference voltage when said first pulse-phase-difference coding circuit is supplied with said analog voltage signal,
correcting said A/D-converted data set of said analog voltage signal outputted from said first pulse-phase-difference coding circuit on the basis of difference between said first and second A/D-converted data sets outputted from said second pulse-phase-difference coding circuit;
determining three compensation factors from said A/D-converted data sets of said reference voltage, said high compensation voltage and said low compensation voltage outputted from said first pulse-phase-difference coding circuit; and correcting said A/D-converted data set of said analog voltage signal by performing a second-order compensation using said three compensation factors to compensate for nonlinearity of said first pulse-phase-difference coding circuit.

8. An A/D converter for converting an analog voltage signal into a digital signal comprising:
a pulse-phase-difference coding circuit which includes:
a pulse-circulating circuit having a plurality of delay gates connected in a form of a ring, delay times of said delay gates depending on a voltage applied to said delay gates as a power supply voltage thereof;
a counter outputting a count signal representing the number of times that a pulse circulating in said pulse-circulating circuit has traveled around said pulse-circulating circuit during a sampling time defined by a phase difference between sampling control signals supplied to said pulse-circulating circuit; and
a position signal generating device generating a position signal representing a position of said pulse within said pulse-circulating circuit;
said pulse-phase-difference coding circuit outputting a combination of said count signal and said position signal as an A/D-converted data of an analog voltage signal applied to said delay gates as said power supply voltage;

a control circuit operating to supply said pulse-circulating circuit with said sampling control signals in order that said counter outputs said count signal and said position signal generating device generates said position signal at each lapse of said sampling time;

a differential data set calculating device outputting a differential data set representing a difference between two A/D-converted data sets of said analog voltage signal successively outputted from said pulse-phase-difference coding circuit; and a digital low-pass filter filtering said differential data set outputted from said differential data set calculating device.

9. An A/D converter according to claim 8, wherein said differential data set calculating device includes a first latch circuit latching an A/D-converted data set of said analog voltage signal outputted from said pulse-phase-difference coding circuit in synchronization with said sampling control signals, a second latch circuit latching said A/D converted data set latched in said first latch circuit in synchronization with said sampling control signals, and a subtraction circuit subtracting said A/D-converted data set latched in said second latch circuit from an A/D-converted data set latched in said first latch circuit.

10. An A/D converter according to claim 8, further comprising:

an input selection switch for supplying said pulse-phase-difference coding circuit with said analog voltage signal and a reference voltage in an alternating sequence as said power supply voltage;

a register for storing an A/D-converted data set of said reference voltage outputted from said pulse-phase-difference coding circuit; and a divider for dividing said differential data set filtered by said digital low-pass filter by said A/D-converted data set stored in said register, said control circuit setting said sampling time longer when said pulse-phase-difference coding circuit is supplied with said reference voltage than when said pulse-phase-difference coding circuit is supplied with said analog voltage signal.

11. An A/D converter according to claim 10, wherein, when said pulse-phase-difference coding circuit is supplied with said reference voltage, said control circuit lengthens said sampling time to such an extent that resolution of said A/D-converted data of said reference voltage becomes equivalent to resolution of said differential data set filtered by said digital low-pass filter.

12. A method of converting an analog voltage signal into a digital signal by use of a pulse-phase-difference coding circuit which includes:

a pulse-circulating circuit having a plurality of delay gates connected in a form of a ring, delay times of said delay gates depending on a voltage applied to said delay gates as a power supply voltage thereof;

a counter outputting a count signal representing the number of times that a pulse circulating in said pulse-circulating circuit has traveled around said pulse-circulating circuit during a sampling time defined by a phase difference between sampling control signals supplied to said pulse-circulating circuit; and a position signal generating device generating a position signal representing a position of said pulse within said pulse-circulating circuit;

said pulse-phase-difference coding circuit outputting a combination of said count signal and said position signal as A/D-converted data of an analog voltage signal applied to said delay gates as said power supply voltage;

said method comprising the steps of:

supplying said pulse-circulating circuit with said sampling control signals in order that said counter outputs said count signal and said position data generating device generates said position signal at each lapse of said sampling time;

calculating a differential data set representing a difference between two A/D-converted data sets of said analog voltage signal successively outputted from said pulse-phase-difference coding circuit; and low-pass filtering said differential data set.

13. A method of converting an analog voltage signal into a digital signal according to claim 12, further comprising the steps of:

latching, in a first latch circuit, an A/D-converted data set of said analog voltage signal outputted from said pulse-phase-difference coding circuit in synchronization with said sampling control signals;

latching, in a second latch circuit, said A/D-converted data set latched in said first latch circuit in synchronization with said sampling control signals; and subtracting said A/D-converted data set latched in said second latch circuit from an A/D-converted data set latched in said first latch circuit.

14. A method of converting an analog voltage signal into a digital signal according to claim 12, wherein an IIR filter is used as said digital low-pass filter.

15. A method of converting an analog voltage signal into a digital signal according to claim 12, wherein said pulse-phase-difference coding circuit is supplied, as said power supply voltage, with said analog voltage signal and a reference voltage in an alternating sequence, an A/D-converted data set reference voltage outputted from said pulse-phase-difference coding circuit being stored in a register, said sampling time when said pulse-phase-difference coding circuit is supplied with said reference voltage being longer than when said pulse-phase-difference coding circuit is supplied with said analog voltage signal and wherein said method further comprises the step of dividing said low-pass filtered differential data set by said A/D-converted data set stored in said register.

16. A method of converting an analog voltage signal into a digital signal according to claim 15, wherein said control circuit lengthens said sampling time when said pulse-phase-difference coding circuit is supplied with said reference voltage to such an extent that resolution of said A/D-converted data set of said reference voltage becomes equivalent to resolution of said low-pass filtered differential data set.

* * * * *